United States Patent
Shimano et al.

(10) Patent No.: US 6,388,929 B1
(45) Date of Patent: May 14, 2002

(54) SEMICONDUCTOR MEMORY DEVICE PERFORMING REDUNDANCY REPAIR BASED ON OPERATION TEST AND SEMICONDUCTOR INTEGRATED CIRCUIT DEVICE HAVING THE SAME

(75) Inventors: Hiroki Shimano; Kazutami Arimoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/906,654

(22) Filed: Jul. 18, 2001

(30) Foreign Application Priority Data

Jul. 26, 2000 (JP) ........................................ 2000-225636
Mar. 1, 2001 (JP) ....................................... 2001-056998

(51) Int. Cl.[7] .............................................. G11C 29/00
(52) U.S. Cl. ....................................... 365/201; 365/200
(58) Field of Search ................................ 365/200, 201, 365/230.03

(56) References Cited

U.S. PATENT DOCUMENTS 6,246,617 B1 * 6/2001 Urakawa .................... 365/200
6,246,618 B1 * 6/2001 Yamamoto et al. ..... 365/189.02
6,297,997 B1 * 10/2001 Ohtani et al. .......... 365/189.07
6,310,807 B1 * 10/2001 Ooishi et al. ................ 365/200

FOREIGN PATENT DOCUMENTS

| JP | 63-164100 | 7/1988 |
| JP | 07-093988 | 4/1995 |

* cited by examiner

*Primary Examiner*—Son Mai
(74) *Attorney, Agent, or Firm*—McDermott, Will & Emery

(57) ABSTRACT

A BIST circuit conducts an operation test on a memory cell array to detect a defective memory cell when power is turned on. On the basis of a result of the operation test, the BIST circuit generates a redundancy code indicative of a defect address corresponding to a defective memory cell. The redundancy code is transmitted to a repair determining circuit in a decoding circuit. The repair determining circuit stores the redundancy code in a volatile manner during the power is on. When an input address coincides with the redundancy code to be stored on the inside, the repair determining circuit executes an access to a corresponding spare memory cell area.

18 Claims, 18 Drawing Sheets

SEMICONDUCTOR MEMORY DEVICE PERFORMING REDUNDANCY REPAIR BASED ON OPERATION TEST AND SEMICONDUCTOR INTEGRATED CIRCUIT DEVICE HAVING THE SAME

TITLE OF THE INVENTION

Semiconductor Memory Device Performing Redundancy Repair Based on Operation Test and Semiconductor Integrated Circuit Device Having the Same

BACKGROUND OF THE INVENTION

1. Field of the Invention

The present invention relates to a semiconductor integrated circuit device and, more particularly, to a system LSI on which a memory is mounted. More specifically, the invention relates to the configuration of a memory core capable of executing redundancy repair on the basis of an operation test without using a fuse device.

2. Description of the Background Art

A system LSI such as a logic merged DRAM, in which a logic such as a processor or an ASIC (Application Specific Integrated Circuit) and a dynamic random access memory (DRAM) of a mass storage capacity are integrated on the same semiconductor chip (semiconductor substrate) has been developed. In such a system LSI, the logic and the memory such as a DRAM are connected to each other via a multi-bit internal data bus of 128 to 512 bits, thereby enabling data transfer speed higher than that of a general purpose DRAM by at least one or two orders of magnitude to be realized.

The DRAM and the logic are connected to each other via an interconnection. Since the interconnection is sufficiently shorter and has a small parasitic impedance than an on-board interconnection, a large reduction in charging/discharging currents in a data bus as well as high-speed signal transfer can be realized. As compared with a method of attaching a general purpose DRAM on the outside to the logic, the number of pin terminals on the outside of the logic is smaller.

For these reasons, the system LSI such as a logic merged DRAM largely contributes to higher performances of information devices for executing processes dealing with various data such as three-dimensional graphics process and image and audio process.

In such a system LSI, an increase in capacity and an increase in the number of kinds of memory cores to be mounted are conspicuous in the stream of forming a system on a chip. On a general memory, a redundancy circuit for replacement repairing a defective memory cell with a spare memory cell is mounted to assure a good yield as a design rule becomes finer in correspondence with larger capacity and higher packing density. Similarly, such a redundancy circuit has to be mounted on a memory core which is mounted on a system LSI.

In order to execute redundancy repair, it is necessary to conduct an operation test on a memory core as a target to be tested to thereby specify a defect address corresponding to a defective memory cell from the result of the operation test. Generally, the defect address is programmed in the memory core by blowing a fuse by using a laser trimming apparatus or the like. In normal operation, an input address is compared with a defective address. When they coincide with each other, by accessing a spare memory cell in place of a regular memory cell, the redundancy repair using a redundancy circuit is conducted.

When an operation test on a memory core mounted on a system LSI is carried out via a logic unit, it is feared that a test of an operation timing margin or the like on the memory cannot be accurately performed and that a sufficient test cannot be conducted since the number of test patterns generated by the logic is limited from the viewpoint of a program capacity. What is called a direct memory access test for directly testing a memory core such as a DRAM core from the outside of a system LSI via a dedicated tester such as a memory tester is therefore conducted.

FIG. 26 is a block diagram for explaining the direct memory access test using a test interface circuit.

Referring to FIG. 26, a DRAM core 500 as a target to be tested operates in response to a command control signal inCMD and an address signal inADD which are received from a selector 504 and an operation clock DCLK received from a gate 506. The DRAM core 500 receives write data inDin and outputs read data inDout.

A test interface circuit TIC receives a test clock TST_CLK, a test command signal TST_CMD, a test address signal TST_ADD and test input data TST_Din from a memory tester as an external tester and outputs test output data TST_Dout to the memory tester.

In a manner similar to a general DRAM, each of the test input data TST_Din supplied to the test interface circuit TIC and the test output data TST_Dout outputted from the test interface circuit TIC is set to have a bit width of, for example, 8 bits. On the other hand, the bit width of the DRAM core 500 is as wide as, for example, 256 bits. The test interface circuit TIC expands the 8-bit test input data TST_Din to 256-bit write data TST_Din, selects data of 8 bits from the 256-bit test output data TST_Dout from the DRAM core and outputs the data as the test output data TST_Dout to the memory tester.

In normal operation, the gate 506 supplies a clock signal CLK which is sent from the logic unit as the operation clock DCLK to the DRAM core 500. On the other hand, in a test mode, the gate 506 supplies the test clock TST_CLK which is received from the memory tester as the operation clock DCLK to the DRAM core 500.

The test interface circuit TIC receives the test command signal TST_CMD and the test address signal TST_ADD from the memory tester at a timing synchronized with the test clock TST_CLK and outputs a test command signal TIC-CMD and a test address signal TIC-ADD. The group of signals generated by the test interface circuit TIC is supplied to the selector 504. The selector 504 also receives a logic command, a logic address and a logic data input from the logic unit.

The selector 504 operates in response to a test mode entry signal TE. The test mode entry signal TE is activated in the test mode and is inactivated in normal operation. In normal operation, therefore, the selector 504 supplies the command signal and the address signal from the logic unit as signals inCMD and inADD to the DRAM core 500. On the other hand, in the test mode, the selector 504 supplies the test command signal TIC-CMD and the test address signal TIC-ADD which are supplied from the test interface circuit TIC as the internal command signal inCMD and the address signal inADD to the DRAM core 500.

By providing such a test interface circuit TIC, an external memory tester can directly access the DRAM core 500. Consequently, the direct memory access test can be carried out. A necessary operation test on the DRAM core 500 can be therefore conducted by using a general SDRAM memory tester.

For a system LSI on which a plurality of memory cores are mounted, however, when the direct memory access test using the test interface circuit TIC as described above is adopted, the operation test for redundancy repair has to be sequentially executed on the plurality of memory cores. The number of operation tests for redundancy repair is therefore large. Since the test interface circuit has to be disposed in correspondence with each of the memory cores, it increases the chip size.

For avoiding such problems, a technique of providing a DRAM core with what is called a BIST (Built In Self Test) function so that the DRAM core itself conducts an operation test is known.

FIG. 27 is a schematic block diagram showing the configuration of a conventional DRAM core 510 having the BIST function.

Referring to FIG. 27, the DRAM core 510 comprises: a control circuit 20 which receives the command control signal CMD and the address signal ADD and controls the whole operations of the DRAM core 510; a memory cell array 30 in which memory cells are arranged in a matrix; a decoding circuit 40 for selecting a memory cell according to the address signal; a data path band 50 for amplifying data read from the memory cell and writing write data to the memory cell array 30; and an input/output buffer 60 for receiving/outputting input/output data between the DRAM core and the outside of the DRAM core.

The memory cell array 30 is divided into a plurality of memory mats MAO to MAn (n: natural number). Each memory mat is divided into a plurality of sub memory arrays by sub word driver bands SWD. In each of the sub memory arrays, sub word lines SWL and bit line pairs BLP are provided in correspondence with rows and columns of the memory cell. A memory cell row is selected hierarchically by a main word line MWL and the sub word line SWL.

A sense amplifier for amplifying data to be transmitted to the bit line pair BLP is divided into sense amplification bands SA0 to SAn+1. The sense amplification bands are provided at both ends of each memory mat. Each sense amplification band has what is called a shared sense amplification structure which is shared by neighboring memory mats.

An internal data bus pair IBP is disposed every plurality of memory cell columns so as to be shared by the memory mats. When it is assumed that each of the internal data bus pairs IBP is disposed every L memory cell columns (L: natural number), the decoding circuit 40 generates a column selection signal to perform L:1 column selection. The column selection signal is transmitted through a column selection line CSL disposed on every sense amplification band.

In each sense amplification band, each internal data bus pair IBP and a bit line pair corresponding to the selected memory cell column are coupled to each other.

The DRAM core 510 further comprises a BIST circuit 520.

The BIST circuit 520 includes: a BIST control unit 110 for controlling execution of an operation test; and an ALPG unit 120 for loading a prestored program of test patterns in accordance with an instruction of the BIST control unit 110 and generating a test pattern by arithmetic operation. The ALPG unit 120 generates a command control signal and an address signal according to the generated test pattern. In the test mode, the control circuit 20 operates the DRAM core 510 on the basis of the command control signal and the address signal generated by the ALPG unit 120.

The BIST circuit 520 further comprises a redundancy repair analyzing unit 130 for generating information for replacement repair on the basis of test data outputted from the memory cell array via the internal data bus pair IBP and the data path band 50 in the test mode.

In a conventional redundancy repair scheme, replacement repair information analyzed by the redundancy repair analyzing unit 130 at the time of the operation test is read by the memory tester or the like. Further, a fuse blowing step is provided after execution of the operation test. On the basis of the read replacement repair information, a defect address corresponding to a defective memory cell is programmed in a fuse circuit 530 in the decoding circuit 40 in a nonvolatile manner. In the fuse blowing step, a necessary fuse blowing operation is executed by a procedure of laser trimming or the like in the fuse circuit 530.

In the DRAM core 510 in which the defect address is programmed as described above, in normal operation, coincidence between the input address signal ADD and the defect address is judged. When a memory cell row or a memory cell column corresponding to the defective memory cell is selected by the address signal, a spare memory cell is accessed in place of the regular memory cell. As a result, even in the case where a defective memory cell occurs in the memory cell array, replacement repair is performed by using the spare memory cell and a normal storing operation can be performed.

As described by referring to FIGS. 26 and 27, also in the case of carrying out the. direct memory access test using the test interface circuit and the operation test based on the BIST function, the program of the failure address necessary to determine the redundancy repair is executed by blowing a fuse in the DRAM core.

FIG. 28 is a schematic block diagram showing the configuration of a conventional system LSI 550 having a DRAM core in which redundancy repair is executed by blowing a fuse.

Referring to FIG. 28, the system LSI 550 comprises a logic unit 2, the DRAM core 510 (50), a CPU (Central Processing Unit) 4, and an analog core 6 which are connected via an internal line 8. The logic unit 2 is coupled to an external terminal 555 and can receive/transmit data from/to the outside.

In the DRAM core 500 or 510, the fuse circuits 530 for determining redundancy repair are disposed. The space above the area in which the fuse circuits 530 are provided cannot be used as a chip wiring area since. a laser beam used to blow a fuse has to be passed. Consequently, gate mounting density, that is, packing density of a logic circuit constructed by an ECA (Embedded Cell Array) or the like is limited.

It is also possible to give priority on the degree of freedom in layout design and adopt a configuration in which the fuse circuits 530 are disposed concentratedly in a specific area on the system LSI 550 and signal lines are provided between the fuse circuits disposed concentratedly and each DRAM core. However, the problem of the necessity of an expensive laser trimming apparatus for trimming a fuse is not solved.

In the configuration of a system LSI on which a DRAM core of a large-scale capacity is mounted, therefore, when information necessary for redundancy repair typified by a defect address can be retained in each of the DRAM cores without using a fuse device, the redundancy repair can be executed while maintaining the degree of freedom in layout design without requiring an expensive laser trimming apparatus. Thus, the product yield can be improved.

SUMMARY OF THE INVENTION

It is an object of the invention to provide a semiconductor memory device capable of automatically executing an operation test necessary for redundancy repair on the basis of a BIST function and holding information necessary for redundancy repair into a memory core without using a fuse device, which is suited to be mounted in a system LSI in which a logic unit and a memory core are embedded.

Another object of the invention is to provide a configuration of a semiconductor integrated circuit device capable of efficiently conducting an operation test based on a BIST function necessary for redundancy repair on a plurality of memory cores.

Further another object of the invention is to provide a configuration of a semiconductor device capable of repairing a memory cell as well, which becomes defective later while suppressing the number of test items of an operation test carried out based on a BIST function. By employing a method of performing detection when the power is turned on, detection of a defect and redundancy repair on a detected defect can be efficiently executed.

The invention will be summarized as follows. The invention relates to a semiconductor memory for inputting/outputting data in accordance with an input address, comprising a memory cell array, a self test circuit, and a decoding circuit. The memory cell array stores data by a plurality of regular memory cells and spare memory cells. The self test circuit conducts an operation test on the memory cell array to detect a defective memory cell. The self test circuit includes: a self test control unit for activating the operation test at predetermined time; and a redundancy repair analyzing unit for analyzing data outputted from the memory cell array in the operation test and outputting a plurality of redundancy code signals for indicating a defect address corresponding to the defective memory cell. The decoding circuit selects a memory cell to which the data input and output is performed in accordance with the input address. The decoding circuit includes a repair determining circuit for instructing an access to the spare memory cell when the input address and the defect address coincide with each other. The repair determining circuit has a plurality of redundancy code holding circuits provided in correspondence with the plurality of redundancy code signals. Each of the plurality of redundancy code holding circuits takes in a signal level of corresponding one of the plurality of redundancy code signals outputted from the redundancy repair analyzing unit at the time of conducting the operation test and holds the received signal level.

Therefore, the main advantage of the invention is that the operation test for detecting a defective memory cell can be automatically executed on the basis of the BIST function and the defect address corresponding to the defective memory cell can be stored without using a fuse device. As a result, the restriction on layout in the wiring area on the chip is lessened and the degree of freedom in layout is improved.

According to another aspect of the invention, there is provided a semiconductor integrated circuit device comprising a plurality of memory cores, a self test circuit, a selection control circuit and a selector circuit.

Each of the plurality of memory cores executes data input and output according to an input address. Each of the plurality of memory cores includes: a memory cell array for storing data by a plurality of regular memory cells and a spare memory cell used to be replaced with a defective memory cell detected at the time of an operation test; and a decoding circuit for selecting a memory cell as a target of the data input and output in accordance with the input address. The decoding circuit includes a repair determining circuit for instructing an access to the spare memory cell when the input address and a defect address corresponding to the defective memory cell coincide with each other. The repair determining circuit has a plurality of redundancy code holding circuits provided in correspondence with a plurality of redundancy code signals for indicating the defect address. Each of the plurality of redundancy code holding circuits takes in a signal level of a corresponding one of the plurality of redundancy code signals at the time of the operation test and holds the taken signal level. The self test circuit is shared by the plurality of memory cores and conducts the operation test on the memory cell array to detect a defective memory cell. The self test circuit includes: a self test control unit for activating the operation test; and a redundancy repair analyzing unit for analyzing data outputted from the memory cell array in the operation test and outputting a plurality of redundancy code signals. The selection control circuit selects one of the plurality of memory cores. The selector circuit is disposed between the plurality of memory cores and the self test circuit and couples the one of the memory cores and the self test circuit in accordance with selection by the selection control circuit.

The self test circuit for conducting the operation test for detecting a defective memory cell on the basis of the BIST function is shared by the plurality of memory cores, and the defect address corresponding to a defective memory cell can be stored in each of the memory cores without using fuse devices. As a result, the reduction in layout area and the lessening of the restriction regarding layout of the wiring area on the chip are realized, so that the degree of freedom in layout design is improved.

According to further another aspect of the invention, there is provided a semiconductor memory device for inputting/outputting data in accordance with an input address, comprising a memory cell, a program unit, a self test circuit, a control unit, and a decoding circuit. The memory cell array stores data by a plurality of regular memory cells and a plurality of spare memory units. The program unit stores, in a non-volatile manner, redundancy information for indicating an address of a defect corresponding to a preliminarily detected defective memory cell. The self test circuit for conducting an operation test to detect a defective memory cell to the memory cell array. The self test circuit includes a self test control unit for activating the operation test at predetermined time, and a redundancy repair analyzing unit for analyzing data outputted from the memory cell array in the operation test and outputting redundancy information for indicating a defect address corresponding to a defective memory cell detected by the operation test. The control unit instructs each of the program unit and the redundancy repair analyzing unit to output the redundancy information. The decoding circuit selects a memory cell as a target of the data input and output in accordance with the input address. The decoding circuit includes a plurality of repair determining circuits provided for the plurality of spare memory units. Each of the plurality of repair determining circuits stores one of the plural redundancy information outputted from the program unit and the redundancy repair analyzing unit and instructs an access to a corresponding one of the plurality of spare memory units when the defect address corresponding to the redundancy information stored coincides with the input address.

Therefore, the redundancy repair is performed on the basis of both of information stored in the program unit, for repairing a preliminarily detected defective memory cell, and information for repairing a defective memory cell detected by an operation test conducted on the basis of a BIST function. Thus, a defective memory cell which occurs later can be also repaired while suppressing the number of test items of an operation test conducted on the basis of the BIST function.

The foregoing and other objects, features, aspects and advantages of the present invention will become more apparent from the following detailed description of the present invention when taken in conjunction with the accoanying drawings.

DESCRIPTION OF THE PREFERRED EMBODIMENTS

Figure 1:
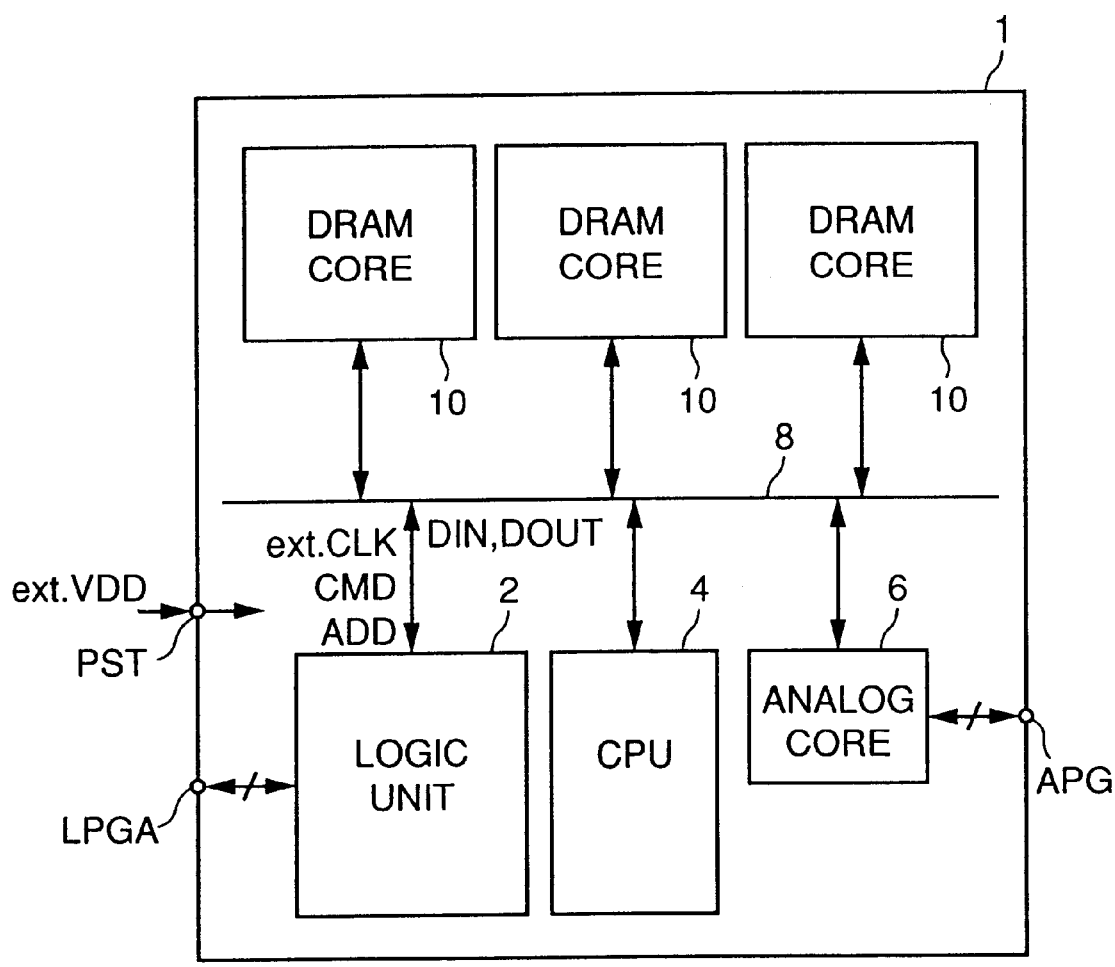
FIG. 1 is a schematic block diagram showing the configuration of a semiconductor integrated circuit device according to a first embodiment of the invention.

Embodiments of the invention will be described in detail hereinbelow with reference to the drawings. The same reference numerals in the drawings denote the same or corresponding elements.

First Embodiment

Referring to FIG. 1, a semiconductor integrated circuit device 1 according to the first embodiment comprises: the logic unit 2 which is coupled to external pin terminals LPGA and executes an instructed process; the CPU 4 for executing a predetermined computing process or the like in accordance with an instruction of the logic unit 2; the analog core 6 which is coupled to a group APG of external pin terminals and executes a process of an analog signal; and DRAM cores 10 for storing data necessary for the logic unit 2. The internal circuits of the semiconductor integrated circuit device 1 are coupled to each other via the internal line 8. The semiconductor integrated circuit device 1 further comprises a power supply pin terminal PST for receiving a power supply voltage ext.VDD.

The logic unit 2 executes a process such as an image/audio information process and includes a memory control unit for controlling an access to the DRAM core 10.

The analog core 6 includes a phase lock loop (PLL) for generating an internal clock signal, an analog-to-digital converter for converting an analog signal supplied from the outside into a digital signal, and a digital-to-analog converter for converting a digital signal supplied from the logic unit 2 into an analog signal and outputting the analog signal.

The DRAM core 10 is a clock synchronized type memory (SDRAM), which receives data and an operation mode instruction signal and outputs data synchronously with a given clock signal. As will become obvious from the following description, the invention relates to the configuration of the DRAM core 10 as a representative example of a memory core. The invention can be therefore applied irrespective of the number of DRAM cores 10 provided.

Figure 2:
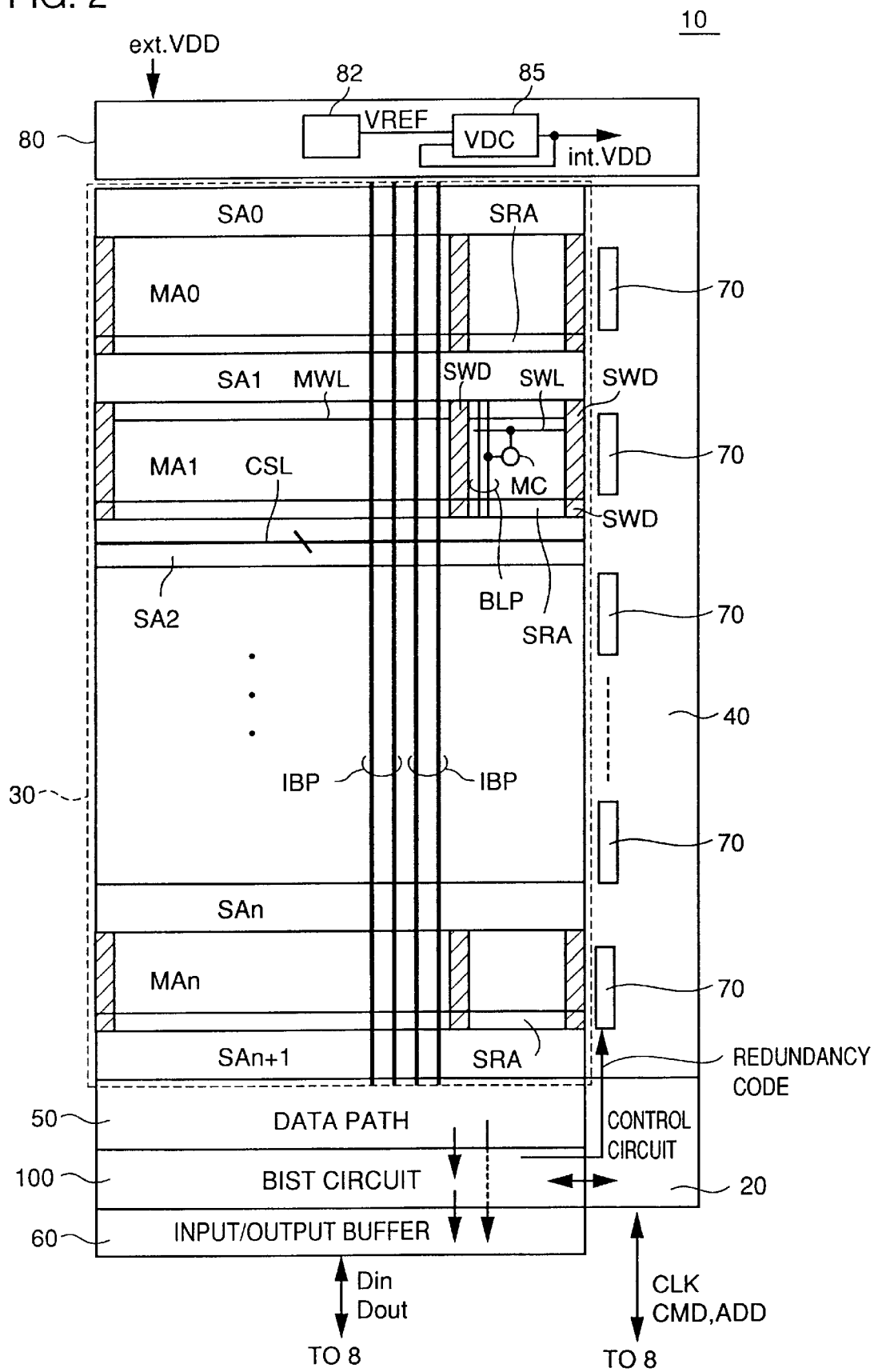
FIG. 2 is a block diagram showing the configuration of a DRAM core according to the finvention.

Referring to FIG. 2, the DRAM core 10 according to the first embodiment comprises: the control circuit 20 which receives the clock signal CLK, a command control signal CMD, and an address signal ADD supplied from the internal line 8 and controls the whole operation of the DRAM core 10; and the memory cell array 30 having a plurality of memory cells arranged in an array.

In the memory cell array 30, the memory cells are disposed so as to be divided into the plurality of memory mats MA0 to MAn. Each memory mat is divided into a plurality of sub memory arrays by the sub word driver bands SWD. An operation of selecting a memory cell row is executed hierarchically by a main word line MWL and a sub word line SWL. In each of the sub memory arrays, sub word lines SWL and bit line pairs BLP are arranged in correspondence with memory cell rows and memory cell columns. The main word line MWL is disposed so as to be common to the plurality of sub memory arrays in the same memory mat. FIG. 2 shows, as an example, the arrangement of the sub word line SWL and the bit line pair BLP corresponding to a single memory cell MC.

Each sub memory array has a spare memory cell area SRA of a row and a spare area (not shown) of a column in which spare memory cells for redundancy repair are disposed. In the embodiment, the redundancy repair using the spare memory cell area SRA will be described as a representative. Redundancy repair using the spare area of a column can be also performed by using the configuration of the present invention which will be specifically described hereinbelow.

A sense amplifier for amplifying transmission data of the bit line pair BLP is divided into sense amplification bands SA0 to SAn+1. Each sense amplification band is shared by neighboring memory mats. For example, the sense amplifying circuit disposed in the sense amplifying band SA1 includes sense amplifying circuits for the memory mats MA0 and MA1.

The DRAM core 10 further includes the decoding circuit 40 for selecting a row and a column in the memory cell array 30 in accordance with the address signal ADD. A word driver (not shown) in the decoding circuit 40 selectively activates the main word lines MWL in accordance with the result of the row selection. The sub word driver (not shown) in the sub word driver band SWD selectively activates the corresponding sub word line SWL in the sub memory array in accordance with the selection of the main word line MWL and a sub decoding signal (not shown).

One internal data bus pair IBP is disposed every L memory cell columns (L: natural number) so as to be common to memory mats. The decoding circuit 40 generates a column selection signal to execute L:1 column selection. The column selection signal is transmitted through the column selection line CSL disposed on each sense amplification band. In the selected memory mat, each data bus pair IBP and a bit line pair selected from the L pairs are selectively coupled to each other.

Read data to be transmitted to the internal data bus pair IBP is amplified by a main amplifier (not shown) in the data path band 50. Write data to be transmitted to the internal data bus pair IBP is driven by a write driver (not shown) in the data path band 50.

The DRAM core 10 further comprises the input/output buffer 60 which is provided between the data path 50 and the internal line 8 and transmits/receives data to/from the internal line 8.

The DRAM core 10 further comprises a BIST circuit 100 for automatically carrying out an operation test on the DRAM core 10. In the following, the operation test executed by the BIST circuit 100 will be also called a self test. The BIST circuit 100 activates a self test in response to a trigger of executing a self test transmitted via the internal line 8 and analyzes a defect address indicative of the defective memory cell on the basis of the result of the self test. The BIST circuit 100 converts the analyzed defect address to a redundancy code and outputs the redundancy code.

The decoding circuit 40 has a repair determining circuit 70 for storing the redundancy code indicative of the defect address corresponding to the defective memory cell which is found at the time of the self test. One or a plurality of repair determining circuits 70 are provided in correspondence with each memory mat. By a single repair determining circuit 70, repair of one defective memory cell is executed. Although the details will be described hereinlater, each of the repair determining circuits 70 stores the redundancy code indicative of the defect address without using a fuse device. The repair determining circuit 70 compares the defect address indicated by the redundancy code information with the address signal. When the defect address to be stored to the inside and the address signal coincide with each other, the corresponding spare memory cell area SRA is used as a target to be accessed in place of the regular memory cell.

Figure 3:
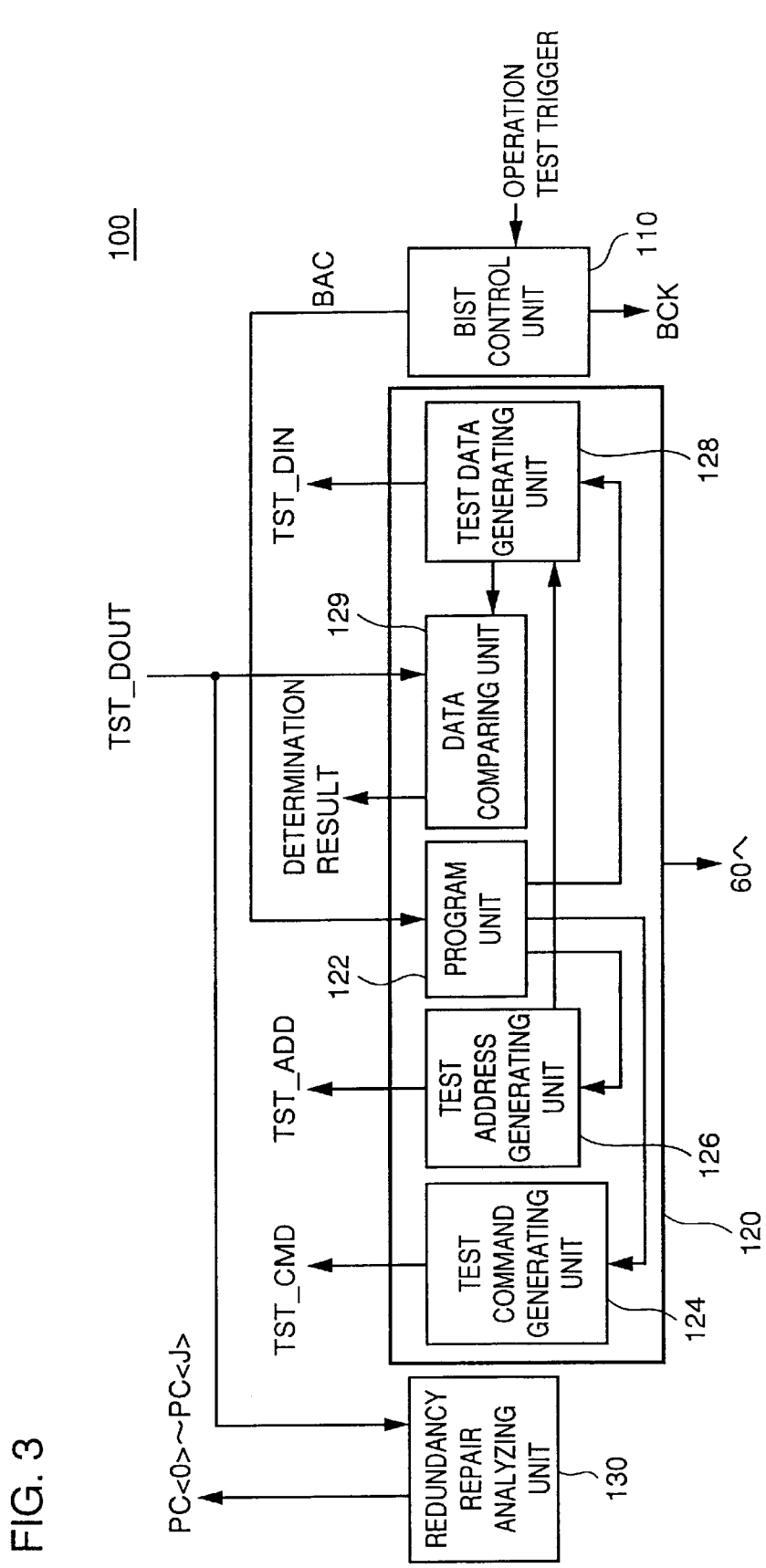
FIG. 3 is a block diagram showing the configuration of a BIST circuit shown in FIG. 2.

Referring to FIG. 3, the BIST circuit 100 comprises the BIST control unit 110, the ALPG unit 120, and the redundancy repair analyzing unit 130.

The BIST control unit 110 activates a BIST activation signal BAC in response to the operation test trigger generated via the internal line 8 and the control circuit 20. The BIST control unit 110 generates an operation clock BCK for use at the time of a self test.

The ALPG unit 120 includes a program unit 122 for activating a program for a self test which is preliminarily held in response to the BIST activation signal BAC, a test command generating unit 124, a test address generating unit 126, and a test data generating unit 128 for generating the test command signal TST_CMD, the test address signal TST_ADD, and the test data TST_DIN, respectively, for executing a predetermined operation test in accordance with the loaded program.

The ALPG unit 120 further includes a data comparing unit 129 which receives test output data TST_DOUT from the memory cell array 30, compares the test output data with an expectation value of the test output data, and outputs a determination result.

The redundancy repair analyzing unit 130 receives the test output data TST_DOUT and analyzes a defect address corresponding to a defective memory cell. The redundancy repair analyzing unit 130 generates the redundancy codes PC<0> to PC<J> (J: natural number) for showing the defect address in correspondence with each defective memory cell.

The set of redundancy codes PC<0> to PC<J> outputted from the redundancy analyzing unit 130 is stored in one of the plurality of repair determining circuits 70. The head redundancy code PC<0>corresponds to a repair determining circuit enable signal /REn for identifying the repair determining circuit 70 into which a redundancy code is stored. The remaining redundancy codes PC<1> to PC<J> correspond to J defect address bits FAD<1> to FAD<J>, respectively to show the defect address.

Figure 4:
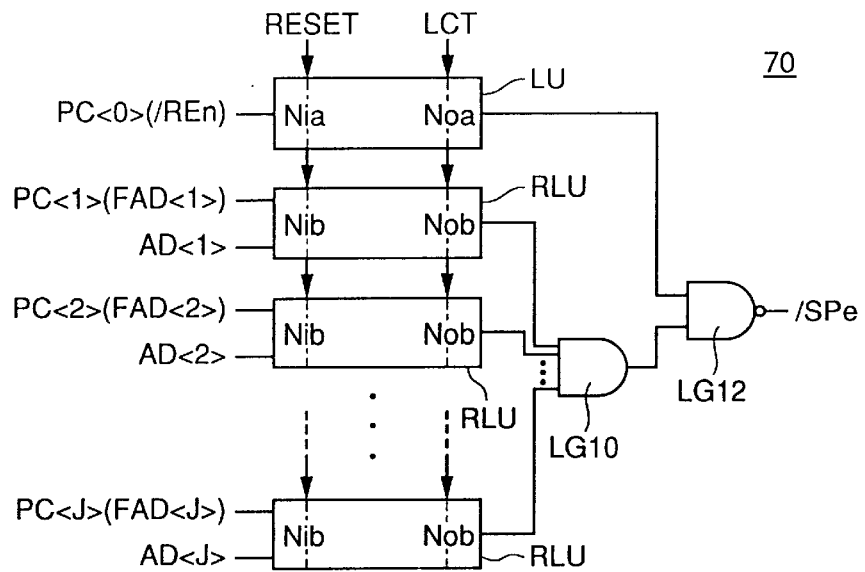
FIG. 4 is a block diagram showing the configuration of a repair determining circuit shown in FIG. 2.

Referring to FIG. 4, the repair determining circuit 70 includes: a latch unit LU for storing the repair determining circuit enable signal /REn; and repair information latch units RLU provided in correspondence with the respective defect address bits. In the repair determining circuit 70 to which defect address bits are stored and which is instructed to execute the redundancy repair, the repair determining circuit enable signal /REn which is activated (to the H level) is stored.

The latch unit LU and each of the repair information latch units RLU operate in response to the reset signal RESET and the latch instruction signal LCT which are generated by the control circuit 20. The reset signal RESET is shared by the repair determining circuits 70, for initializing the data stored in the latch unit LU and each of the repair information latch units RLU. On the other hand, the latch instruction signal LCT is generated for each of the repair determining circuits 70. The latch instruction signal LCT is activated at a timing at which the redundancy code is outputted from the BIST circuit 100 in correspondence with one of the plurality of repair determining circuits 70 disposed in the decoding circuit 40, to which the redundancy code is stored.

The repair determining circuit 70 determines whether the redundancy repair by a spare memory cell is necessary or not by comparison between the address bits AD<1> to AD<J> in the address signal ADD and the failure address bits FAD<1> to FAD<J>.

Figure 5:
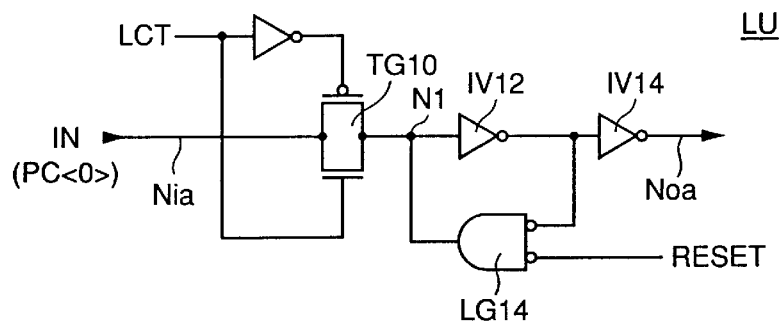
FIG. 5 is a circuit diagram showing the configuration of a latch unit shown in FIG. 4.

Referring now to FIG. 5, the latch unit LU includes: a transfer gate TG10 coupled between an input node Nia and an internal node N1; inverters IV12 and IV14 which are connected in series between the internal node N1 and an output node Noa; and a logic gate LG14 for outputting the result of an NOR logical arithmetic operation between an output signal of the inverter IV12 and the reset signal RESET to the node N1.

The transfer gate TG10 is turned on when the latch instruction signal LCT is activated (to the H level), and transmits a signal sent to the input node Nia to the node N1. In a state where the reset signal RESET is activated to the H level, an output of the logic gate LG14 is fixed to the L level, and the signal level of each of the internal node Ni and the output node Noa is reset and fixed to the L level.

On the other hand, in the case where the reset signal RESET is inactivated to the L level, the logic gate LG14 acts as an inverter which inverts an output signal of the inverter IV12 and outputs the resultant signal to the internal node N1. A latch circuit is formed by the inverter IV12 and the logic gate LG14.

In such a manner, in the latch unit LU, when the reset signal RESET is activated (to the H level), the signal level of the output node Noa is reset to the L level. On the other hand, when the reset signal RESET is inactive (to the L level), the latch unit LU latches the signal level of the input node Nia in response to the activation (to the H level) of the latch instruction signal LCT and outputs it from the output node Noa.

Figure 6:
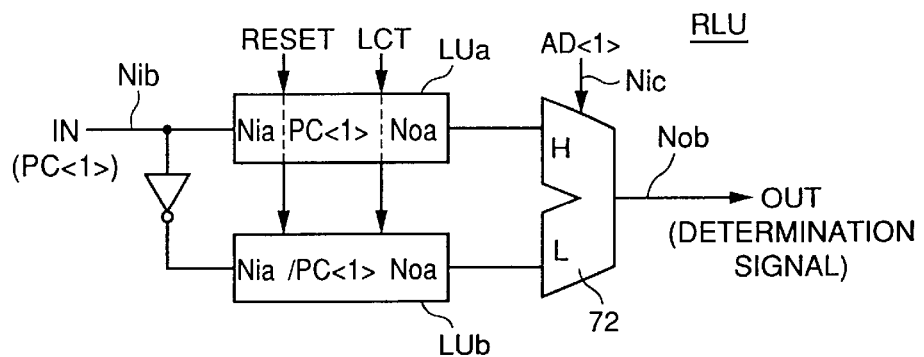
FIG. 6 is a block diagram showing the configuration of a repair information latch unit shown in FIG. 4.

FIG. 6 shows the configuration of the repair information latch unit RLU.

Each of the repair information latch units RLU stores the signal level of a corresponding redundancy code as a defect address bit to the inside and outputs the result of identify comparison of the signal level between a corresponding address bit and a defect address bit stored to the inside. FIG. 6 shows the configuration of a repair information latch unit corresponding to the redundancy code PC<1> (defect address bit FAD<1>) as an example.

Referring to FIG. 6, the repair information latch unit RLU includes: a latch unit LUa for storing the signal level of the redundancy code PC<1> to be transmitted to an input node Nib; and a latch unit LUb for holding /PC<1> which is the inverted signal level of the redundancy code PC<1>. The configuration of each of the latch units LUa and LUb is similar to that of the latch unit LU described with reference to FIG. 5.

The repair information latch unit RLU further comprises a selector 72 which receives outputs of the latch units LUa and LUb and selectively supplies one of the outputs to the output node Nob. When the corresponding address bit AD<1> is at the H level, the redundancy code PC<1> stored in the latch unit LUa is outputted. When the address bit AD<1> is at the L level, the inversion signal /PC<1> of the redundancy code stored in the latch unit LUb is outputted.

When the signal level of the redundancy code PC<1> is at the H level, H-level data is stored in the latch unit LUa and L-level data is stored in the latch unit LUb. When the address bit AD<1> coincides with the redundancy code PC<1>, that is, when the address signal AD<1> is at the H level, data at the H side in the selector 72, that is, the H-level data stored in the latch unit LUa is outputted to the output node Nob. On the other hand, when the address bit AD<1> is at the L level and does not coincide with the redundancy code PC<1>, the L-level data stored in the latch unit LUb is outputted to the output node Nob by the selector 72.

The case where the redundancy code PC<1> is at the L level will now be examined. In this case, L-level data is stored in the latch unit LUa and H-level data is stored in the latch unit LUb. When the address bit AD<1> is at the H level and the redundancy code and the address bit do not coincide with each other, the L-level data stored in the latch unit LUa is outputted to the output node Nob. On the contrary, when the address bitl AD<1> is at the L level and coincides with the redundancy code PC<1>, the H-level data latched in the latch unit LUb is outputted to the output node Nob by the selector 72.

As described above, each of the repair information latch units RLU stores the corresponding redundancy code as a defect address bit to the inside. Each of the repair information latch unit RLU compares the defect address bit to be stored with the corresponding address bit. When both of them coincide with each other, a determination signal to be outputted to the output node Nob is activated to the H level. When both of them do not coincide with each other, the determination signal is inactivated (to the L level).

Referring again to FIG. 4, the repair determining circuit 70 further comprises: a logic gate LG10 for outputting the result of an AND logical operation of J determination signals outputted from the repair information latch units RLU; and a logic gate LG12 for outputting the result of a NAND logical operation between an output signal of the logic gate LG1O and the repair set enable signal /REn latched by the latch unit LU.

The logic gate LG12 is instructed to execute the redundancy repair by the repair determining circuit by the repair determining circuit enable signal /REn, and activates a repair determining signal /SPe (to the L level) when the defect address corresponding to the redundancy code held in the repair determining circuit perfectly coincides with the address signal.

In response to the activation of the repair determination signal /SPe, the decoding circuit 40 stops accessing the regular memory cell and accesses a group SRA of spare memory cells.

A timing of executing a self test by the BIST circuit 100 will now be described.

Figure 7:
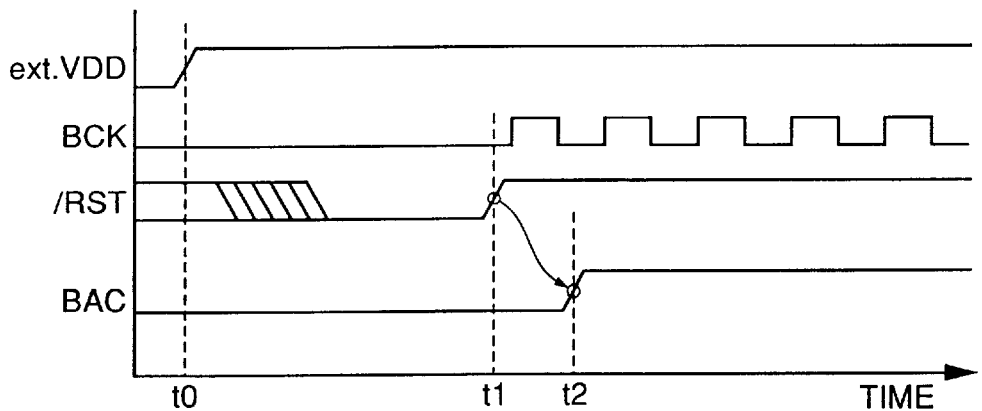
FIG. 7 is a timing chart showing an execution timing of a self test by the BIST circuit shown in FIG. 2.

Referring to FIG. 7, at time tO, an external power supply is activated and a power supply potential ext.VDD is supplied to a power supply terminal pin PST. At the time of turn-on of the power supply, a reset signal /RST shared by the whole semiconductor integrated circuit device 1 is uncertain for a predetermined period until the power supply potential becomes stable. After elapse of the predetermined period, the reset signal /RST is activated (to the L level) to initialize the internal status of the semiconductor integrated circuit device 1. After completion of the initialization of the internal conditions, the reset signal /RST is inactivated (to the H level), and a start-up sequence is executed in each of the circuits in the semiconductor integrated circuit device 1. The reset signal /RST is generated by a memory controller in the logic unit 2.

The BIST control unit 110 receives the reset signal /RST as a trigger to execute a self test. When the reset signal /RST goes inactive (from L level to H level), the BIST control unit 110 starts generating a test clock BCK which is used for an operation test. When the reset signal /RST goes inactive (from L level to H level), the BIST control unit 110 regards the change as a trigger and activates a BIST activation signal BAC for instructing activation of a self test (at time t2).

In response to the activation, the self test by the BIST circuit 100 is executed. When the self test by the BIST circuit 100 is activated, as described above, the redundancy repair analyzing unit 130 executes analysis of the defect address and generates the redundancy code. The generated redundancy code is transmitted to the repair determining circuit 70 in the decoding circuit 40 and stored.

As described above, as part of the start-up sequence executed in response to the turn-on of the power supply, the self test for detecting the defective memory cell is conducted, and the redundancy code corresponding to the defective memory cell is transmitted to the repair determining circuit 70 and is stored in a volatile manner during the power is on. With such a configuration, the defect address corresponding to the defective memory cell can be programmed without using a fuse circuit, and the redundancy repair operation in the normal operation mode can be executed.

Since no fuse device is provided in the DRAM core 10, wires can be provided above the DRAM core 10 on the chip. Thus, the degree of freedom in layout design can be improved.

Figure 27:
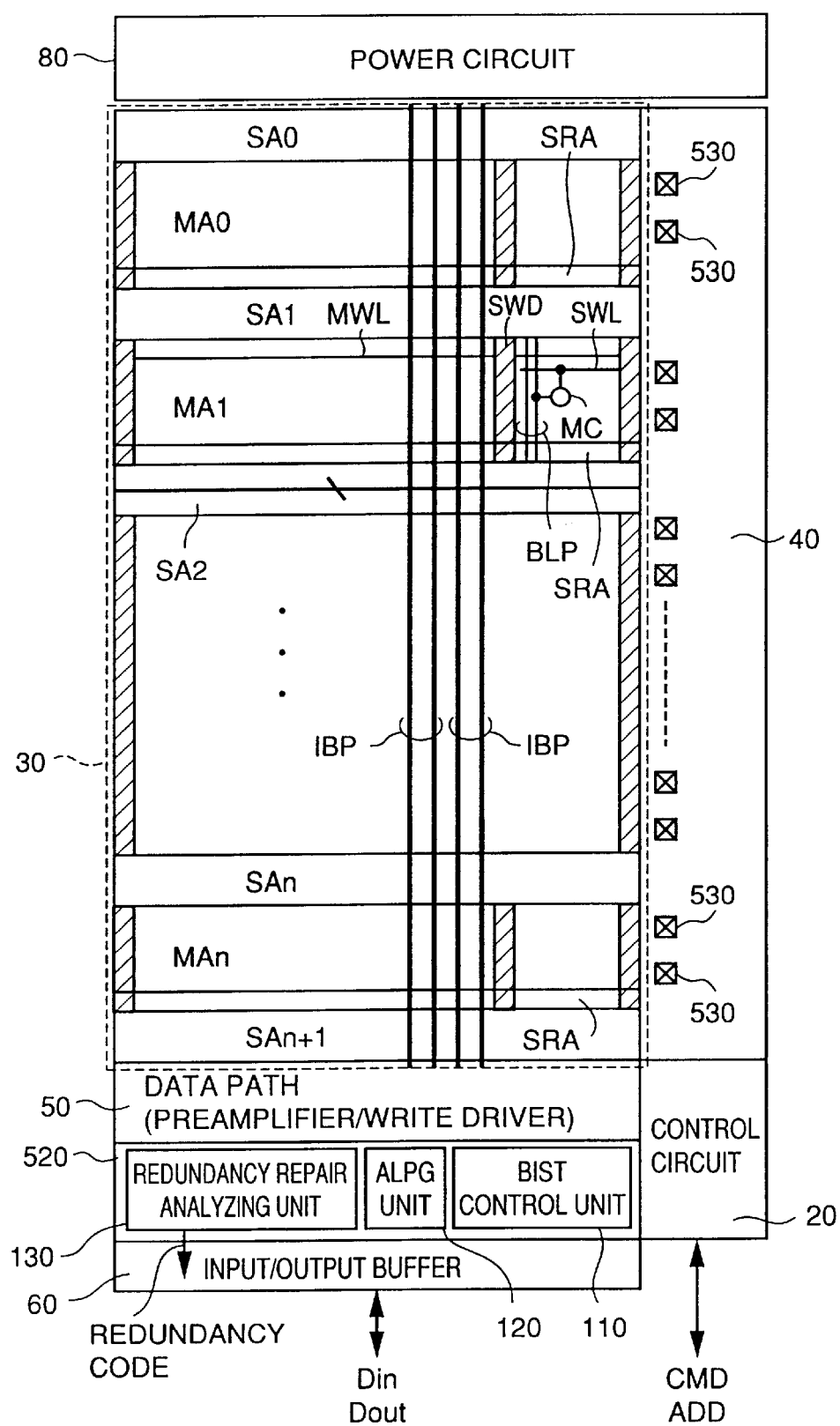
FIG. 27 is a schematic block diagram showing the configuration of a conventional DRAM core having a BIST function.
Figure 28:
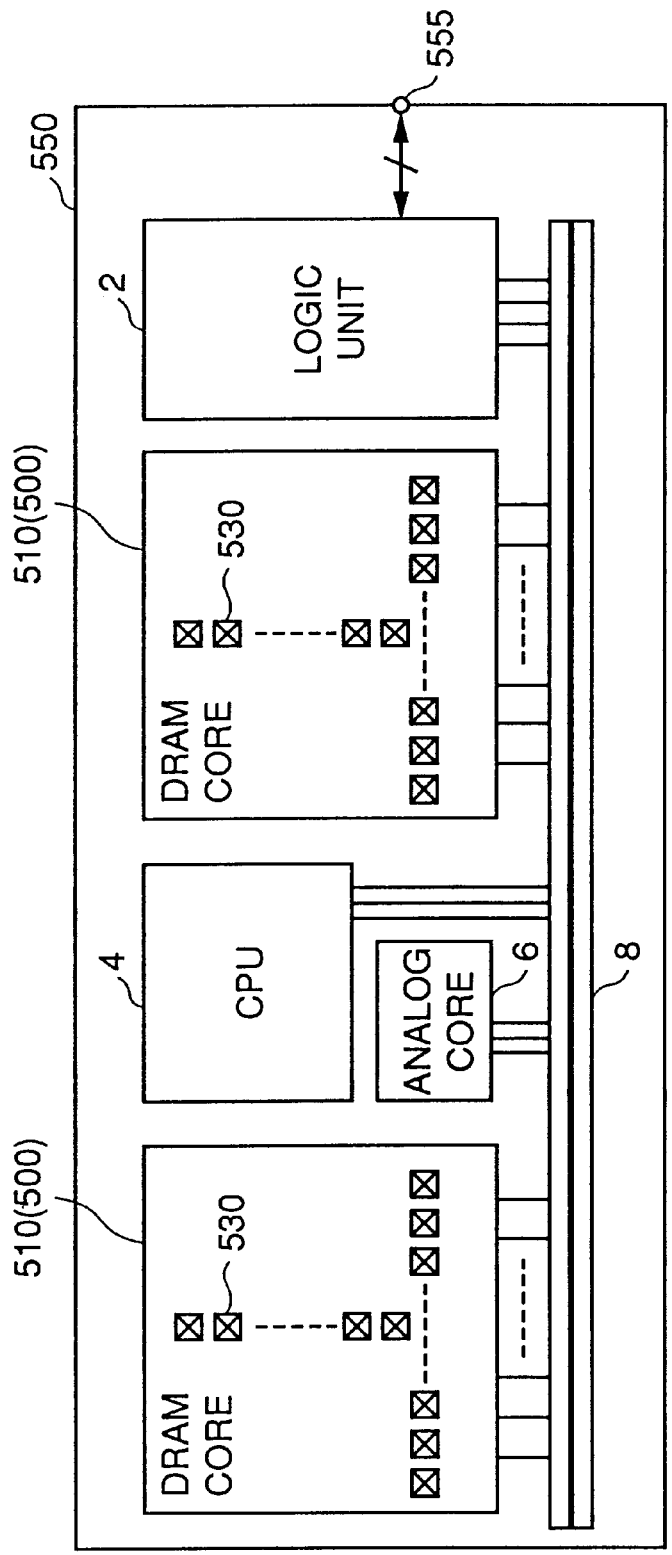
FIG. 28 is a schematic block diagram showing the configuration of a conventional system LSI having a DRAM core in which redundancy repair is executed by blowing a fuse.

As understood from the comparison between FIGS. 2 and 27, the DRAM core 10 according to the first embodiment has a configuration similar to that of the conventional DRAM core 510 using the fuse devices except that the repair determining circuits 70 are disposed in place of the fuse circuits 530. It is, therefore, also advantageous from the viewpoint of layout design that effects as described above can be produced without largely changing the design.

In the redundancy repair method of programming a defect address by a fuse device, which has been described in the background art, a fuse is blown in a wafer state. Therefore, the conventional redundancy repair method basically cannot repair a failure which occurs after a packaging step.

When an electric fuse which can be blown by application of a high voltage is used as the fuse device, a defect address can be programmed by applying a high voltage signal to an external pin terminal on the basis of the result of a self test executed after the packaging step. The method, however, cannot deal with a memory cell, for example, which becomes defective after being assembled in an electronic device or the like and shipped after the product is shipped.

On the contrary, according to the configuration of the present invention, as part of the start-up sequence, a self test is executed and a redundancy code can be generated and stored each time the power is turned on. As a result, a memory cell which becomes defective after being shipped can be also subjected to replacement repair.

Second Embodiment

Figure 8:
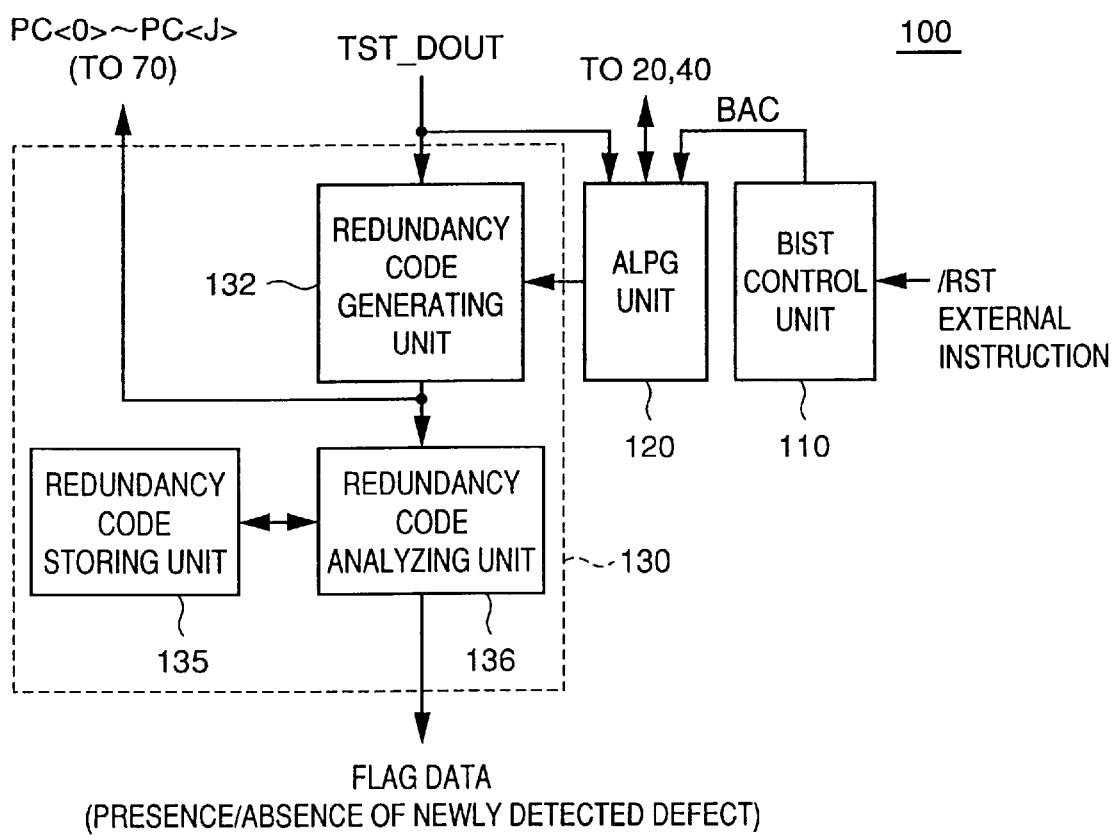
FIG. 8 is a schematic block diagram showing the configuration of a BIST circuit according to a second embodiment.

Referring to FIG. 8, the BIST circuit 100 according to a second embodiment is different from that shown in FIG. 3 with respect to activation of the self test and the configuration of the. repair analyzing unit 130.

In the second embodiment, the BIST control unit 110 activates not only the reset signal /RST at the time of turn-on of the power but also the BIST activation signal BAC in response to an external instruction. The external instruction is supplied to, for example, the group LPGA of external pin terminals. By the configuration, a self test on the DRAM core 10 can be executed at a desired timing. Since the other configuration and operations of the BIST circuit 100 are similar to those described with reference to FIG. 3, detailed description is not repeated here.

The redundancy repair analyzing unit 130 comprises: a redundancy code generating unit 132 for generating a redundancy code corresponding to a detected defective memory cell on the basis of the test output data TST_DOUT from the memory cell array 30 at the time of a self test; a redundancy code storing unit 135 for storing a redundancy code generated at the time of a past self test (for example, immediately preceding self test); and a redundancy code analyzing unit 136.

In the case where a self test is carried out and a redundancy code is generated by the redundancy code generating unit 132, the redundancy code analyzing unit 136 compares the generated redundancy code with a redundancy code to be stored in the redundancy code storing unit 135, and outputs flag data indicative of information regarding a defective memory cell which is newly detected by the self test of this time in accordance with the comparison result.

The flag data indicates the number of defective memory cells which is grasped by, for example, the number of redundancy codes, the presence or absence of a defective memory cell newly detected by the self test of this time, or the like.

As described in the first embodiment, according to the configuration of the invention, the self test is conducted as part of the start-up sequence every turn-on of the power, and a redundancy code can be generated and stored. As a result, a memory cell which becomes defective after the product is shipped can be also automatically subjected to a replacement repair one by one.

There is however a case such that at the time of, for example, a burn-in test conducted after packaging, not only a defect which occurs after packaging is automatically repaired but also the user desires that the defect is detected from the outside. In this case, by providing the BIST circuit according to the second embodiment, each time a self test is conducted, the presence or absence of a memory cell which newly becomes defective can be checked and the result of the test can be monitored from the outside.

Third Embodiment

The first embodiment has been described with respect to the configuration of conducting the self test and storing the redundancy code as part of the start-up sequence which is performed when the power is turned on. The third embodiment will be described with respect to a configuration of automatically conducting an operation test on a memory core in accordance with an operating state of a system such as an electronic device after a system LSI is mounted on the electronic device.

Figure 9:
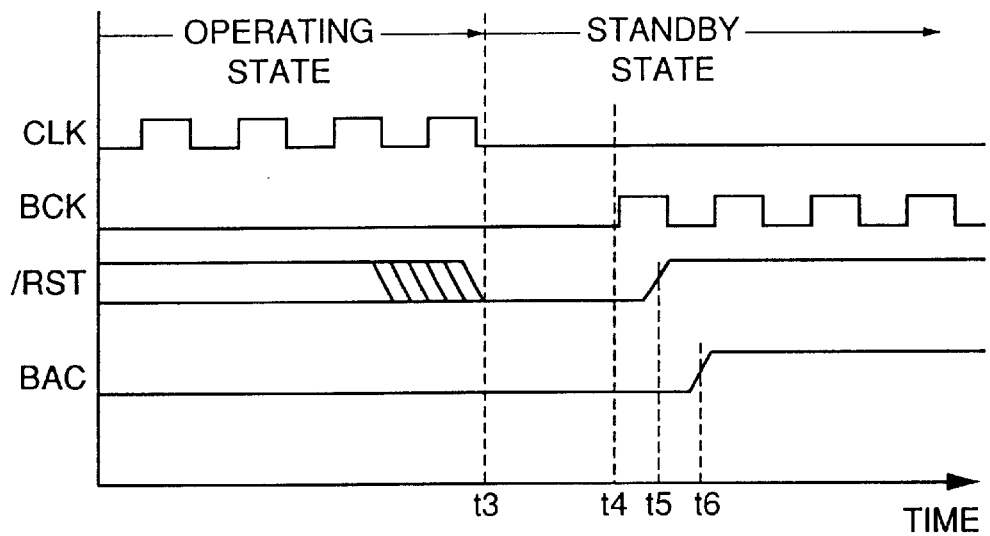
FIG. 9 is a timing chart for explaining a timing of activating a self test according to a third embodiment.

FIG. 9 is a timing chart for explaining a timing of activating a self test according to the third embodiment.

Referring to FIG. 9, when a whole system on which the semiconductor integrated circuit device 1 is mounted shifts to a standby state, in response to a control signal supplied to the group LPGA of external pin terminals, the semiconductor integrated circuit device 1 stops the supply of a clock signal ext.CLK from the logic unit 2 at time t3.

The BIST control unit 110 starts generating the test clock BCK for conducting the self test at time t4 after elapse of predetermined time from the time t3 at which the shift to the standby state is confirmed.

Also at the time of the shift to the standby state, the reset signal /RST changes from an uncertain state to the active state (L level) and goes inactive (from L level to H level) at time t5. In response to the inactivation, at time t6, the BIST control unit 110 activates the BIST activation signal BAC in response to the shift to the standby state in addition to the turn-on of the power. By the operations, in response to the shift to the standby state of the system on which the semiconductor integrated circuit device 1 is mounted, a self test on the DRAM core 10 is activated.

Consequently, the self test explained in the first embodiment is conducted, and the redundancy code corresponding to the detected defective memory cell is generated and is stored into the repair determining circuit.

Figure 10:
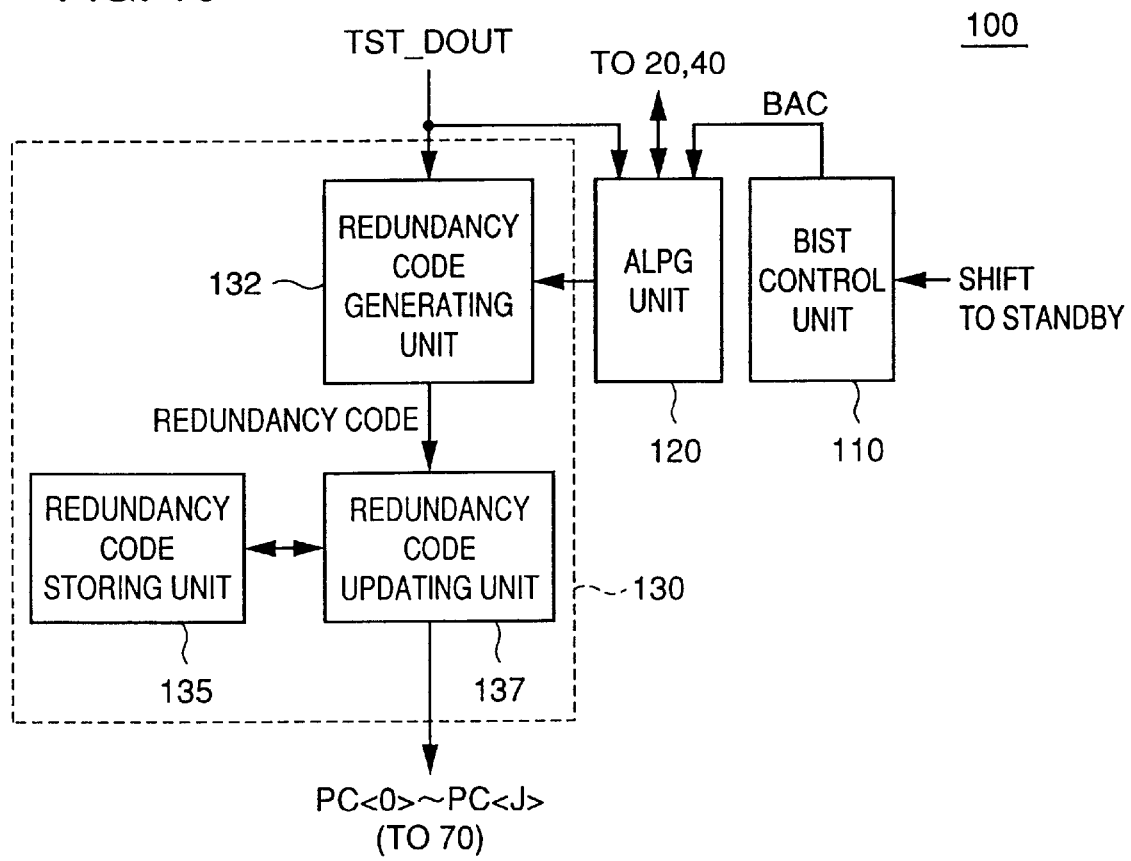
FIG. 10 is a block diagram showing the configuration of a BIST circuit according to a third embodiment.

Referring to FIG. 10, the BIST control unit 110 according to the third embodiment detects that the whole system has shifted to the standby state by detecting a mode signal generated by the logic unit 2 or detecting the stop of supply of the clock signal CLK to the control circuit 20. In response to the shift, the BIST control unit 110 starts generating the test clock BCK and further activates the BIST activation signal BAC for starting an operation test.

The ALPG unit 120 conducts a predetermined self test for detecting a defective memory cell on the memory cell array 30 in response to the BIST activation signal BAC.

The redundancy repair analyzing unit 130 includes the redundancy code generating unit 132, the redundancy code storing unit 135, and a redundancy code updating unit 137. The redundancy code storing unit 135 stores a redundancy code generated in a past self test (for example, immediately preceding self test). The redundancy code. updating unit 137 generates a redundancy code by obtaining a logical OR operation between the redundancy code stored in the redundancy code storing unit 135 and the redundancy code generated by the self test of this time. Consequently, not only the group of defective memory cells which are found at the time of past self tests but also the defective memory cell newly detected by the operation test of this time can be subjected to redundancy repair.

In the third embodiment, at the time of the self test, the redundancy codes PC<0> to PC<J> generated by the redundancy code updating unit 137 are transferred to the repair determining circuit 70 and stored. Also in the case where a memory cell which has been decided as defective in a past self test is determined as non-defective by mistake due to an erroneous self test newly activated, the memory cell can be certainly subjected to redundancy repair.

With such a configuration, by monitoring the DRAM core as occasion such as the standby mode or the like arises, the redundancy code for redundancy repair can be updated. Further, at the time of updating the redundancy code, the redundancy code is reflected in consideration of the result of the immediately preceding operation test. Thus, the detection of defective memory cells and the redundancy repair can be executed with high reliability.

Fourth Embodiment

In the fourth embodiment, a configuration of reducing the number of signal lines necessary to transmit a redundancy code to be sent from the BIST circuit 100 to the repair determining circuit 70 will be described.

Figure 11:
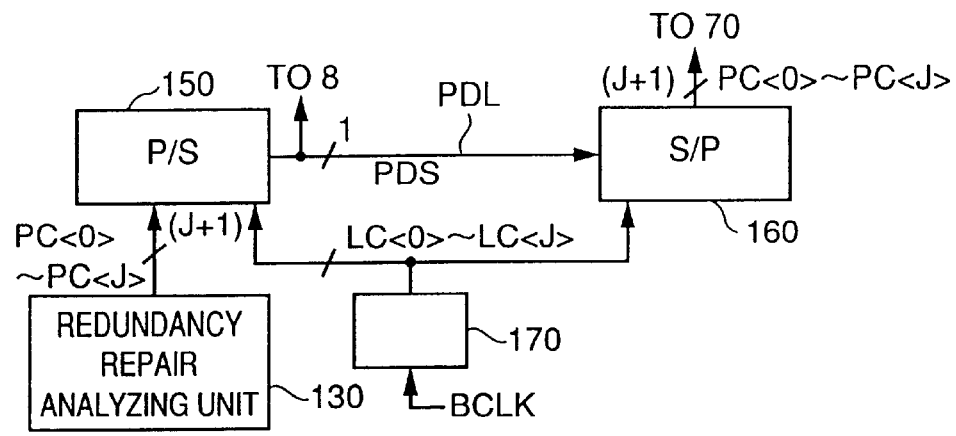
FIG. 11 is a block diagram for explaining transmission of a redundancy code according to a fourth embodiment.

With reference to FIG. 11, the transfer of the redundancy code according to the fourth embodiment will be described.

In FIG. 11, in the fourth embodiment, data converting circuits 150 and 160 are further disposed between the redundancy repair analyzing unit 130 for generating a redundancy code and the repair determining circuits 70 for storing the redundancy code. Between the data converting circuits 150 and 160, a redundancy code line PDL is disposed. The data converting circuits 150 and 160 operate synchronously with latch clocks LC<0> to LC<J> generated by a latch clock generating circuit 170.

As already described, the redundancy code generated by the redundancy repair analyzing unit 130 is a parallel signal of (J+1) bits generated from the repair determining circuit enable signal /REn and defect address bits of J bits.

The data converting circuit 150 receives the redundancy code of (J+1) bits in a parallel state, executes a parallel-to-serial conversion of data, and outputs a redundancy code stream signal PDS of one bit to the redundancy code line PDL.

The data converting circuit 160 is disposed within the decoding circuit 40, receives the redundancy code stream signal PDS from the redundancy code line PDL, performs a serial-to-parallel conversion of data, and transmits each of the redundancy codes in a parallel state to the repair determining circuit 70.

In such a configuration, a signal line of one bit is used as the redundancy code line PDL for transmitting a redundancy code.

In the following, a case in which a redundancy code consists of 8 bits will be described as an example with respect to the transfer of the redundancy code via the redundancy code stream signal on the basis of the data serial/parallel conversion.

Figure 12:
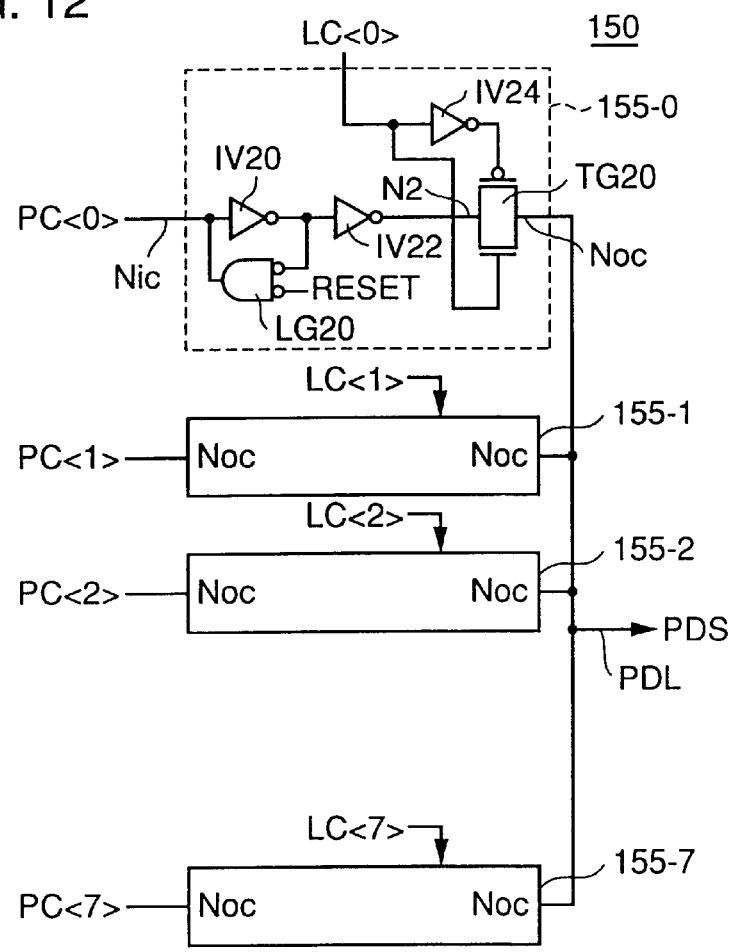
FIG. 12 is a block diagram showing the configuration of a data converting ciruit 150.

Referring to FIG. 12, the data converting circuit 150 has a plurality of data converting units 155-0 to 155-7 arranged in parallel in correspondence with bits of the redundancy code. Outputs of the data converting units are transmitted as the redundancy code stream signal PDS to the redundancy code line PDL.

Since the configurations of the data converting units 155-0 to 1557-7 are similar to each other, the configuration of the data converting unit 155-0 corresponding to the head bit PC<0> of a redundancy code (that is, the repair determining circuit enable signal /REn) will be described as a representative.

The data converting unit 155-0 has inverters IV20 and IV22 and a logic gate LG20 which are connected in a manner similar to the inverters IV12 and IV14 and the logic gate LG14 in the latch unit LU described in FIG. 5. In the case where the reset signal is activated (to the H level), the data converting unit 155-0 fixes the signal level of the node N2 to the L level. On the other hand, in the case where the reset signal is inactivated (to the L level), the data converting unit 155-0 holds the signal level of the redundance code PC<0> at the node N2.

The data converting unit 155-0 further comprises a transfer gate TG20 which is coupled between the node N2 and the output node Noc and is turned on or off in response to the latch clock LC<0>. The output node Noc is coupled to the redundancy code line PDL.

With such a structure, the data converting unit 155-0 transfers the signal level of the redundancy code PC<0> to the redundancy code line PDL at a timing corresponding to the activation (to the H level) of the latch clock LC<0>.

The other data converting units 155-1 to 155-7 operate in response to the latch clocks LC<1> to LC<7>, respectively.

Figure 13:
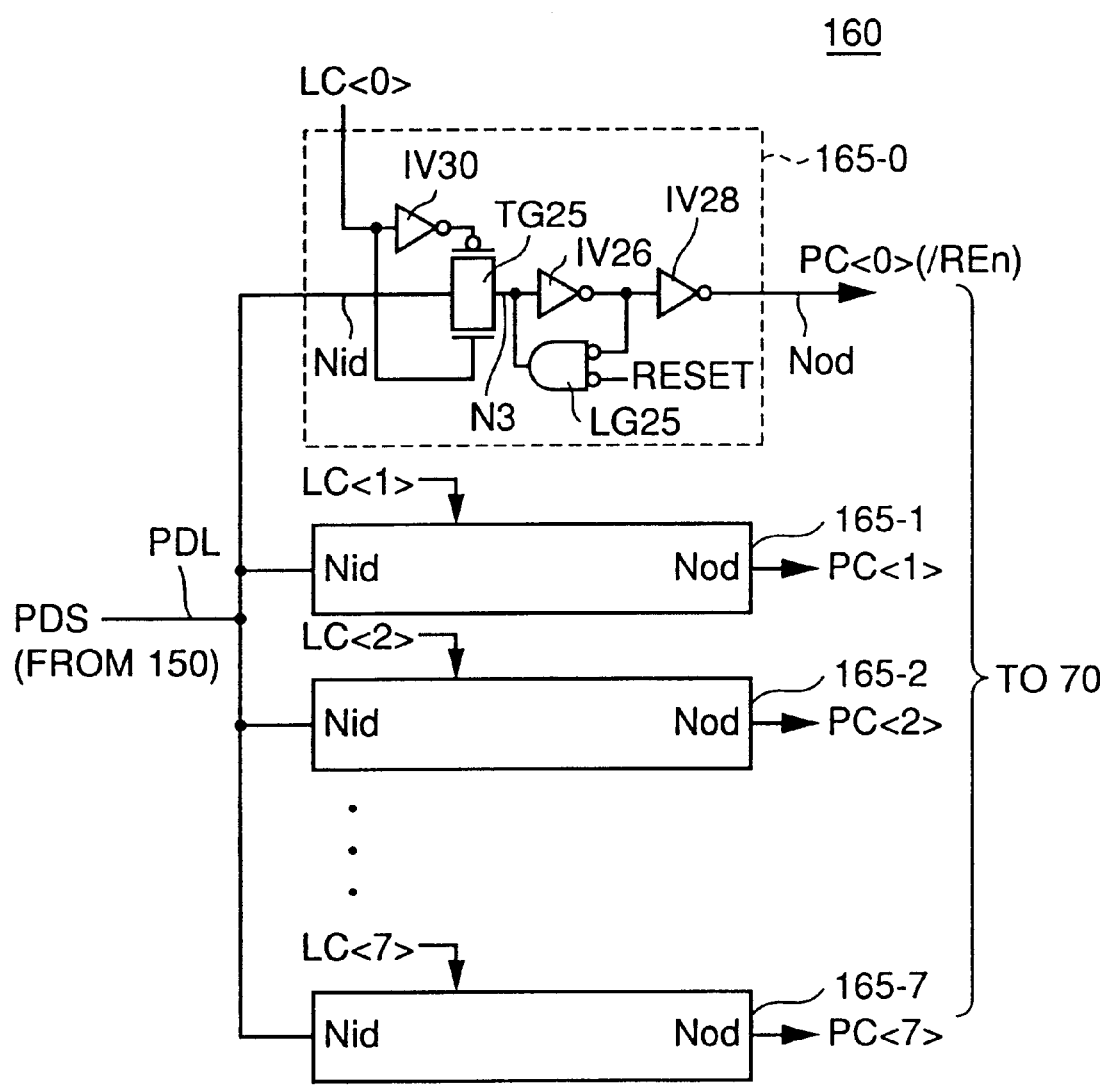
FIG. 13 is a block diagram showing the configuration of a data converting circuit 160.

Referring to FIG. 13, the data converting circuit 160 has data converting units 165-0 to 165-7 disposed in correspondence with the redundancy codes PC<0> to PC<7>, respectively. The redundancy code stream signal PDS of one bit is supplied from the redundancy code line PDL to each of the data converting units 165-0 to 165-7. Outputs of the data converting units 165-0 to 165-7 are transmitted to the repair determining circuit 70.

Since the data converting units 165-0 to 165-7 have similar configurations, the configuration of the data converting unit 165-0 will be described as a representative in FIG. 13.

Referring to FIG. 13, the data converting unit 165-0 has a transfer gate TG25 connected between an input node Nid and a node N3 and inverters IV26 and IV28 and a logic gate LG25 which form a latch circuit for holding the signal level of the node N3 and outputting it to the output node Nod. The signal level of the node N3 can be initialized to the L level by the reset signal RESET in a manner similar to the case of the data converting unit 155-0.

The transfer gate TG25 is turned on or off in response to the latch clock LC<0> which is common to the data converting unit 155-0. At a timing when the latch clock LC<0> responds to the activation (to the H level), the signal level of the input node Nid is transmitted to the output node Nod. Consequently, the redundancy code PC<0> outputted from the data converting unit 155-0 can be received by the data converting unit 165-0 via the redundancy code line PDL. In the data converting unit 165-0, the signal level of the redundancy code PC<0> transmitted is latched at the node N3 while the reset signal is inactive (at the L level).

The other data converting units 165-1 to 165-7 operate in response to the latch clocks LC<1> to LC<7>, respectively.

Figure 14:
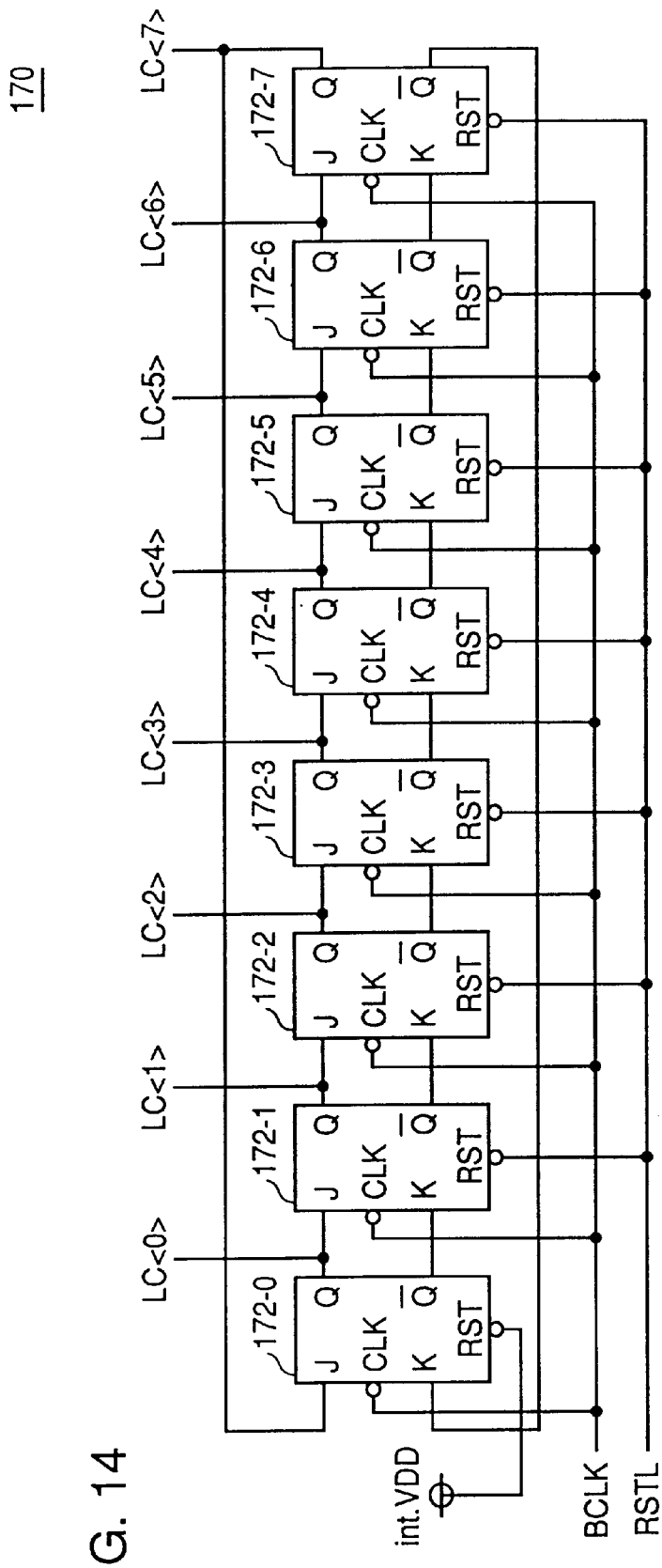
FIG. 14 is a circuit diagram showing the configuration of a latch clock generating circuit shown in FIG. 11.

FIG. 14 shows the configuration of the latch clock generating circuit 170 for generating the eight latch clocks LC<0> to LC<7> which are sequentially activated in a predetermined cycle according to the clock BCLK.

Referring to FIG. 14, the latch clock generating circuit 170 has eight JK flip-flops 172-0 to 172-7 which are connected in series and form what is called a ring counter.

Each of the JK flip-flops 172-0 to 172-7 operates when the clock BCLK is received by the clock terminal CLK. When a reset signal RSTL supplied to each of the reset terminals RST of the JK flip-flops 172-1 to 172-7 is activated (to the L level), the signal level of each of the latch clocks LC<1> to LC<7> outputted from the JK flip-flops 172-1 to 172-7 is fixed to the L level. As the clock BCLK, the test clock BCK can be used. To prevent operation from becoming unstable, an internal power potential int.VDD is applied to the reset terminal RST of the JK flip flop 172-0 at the first stage.

Figure 15:
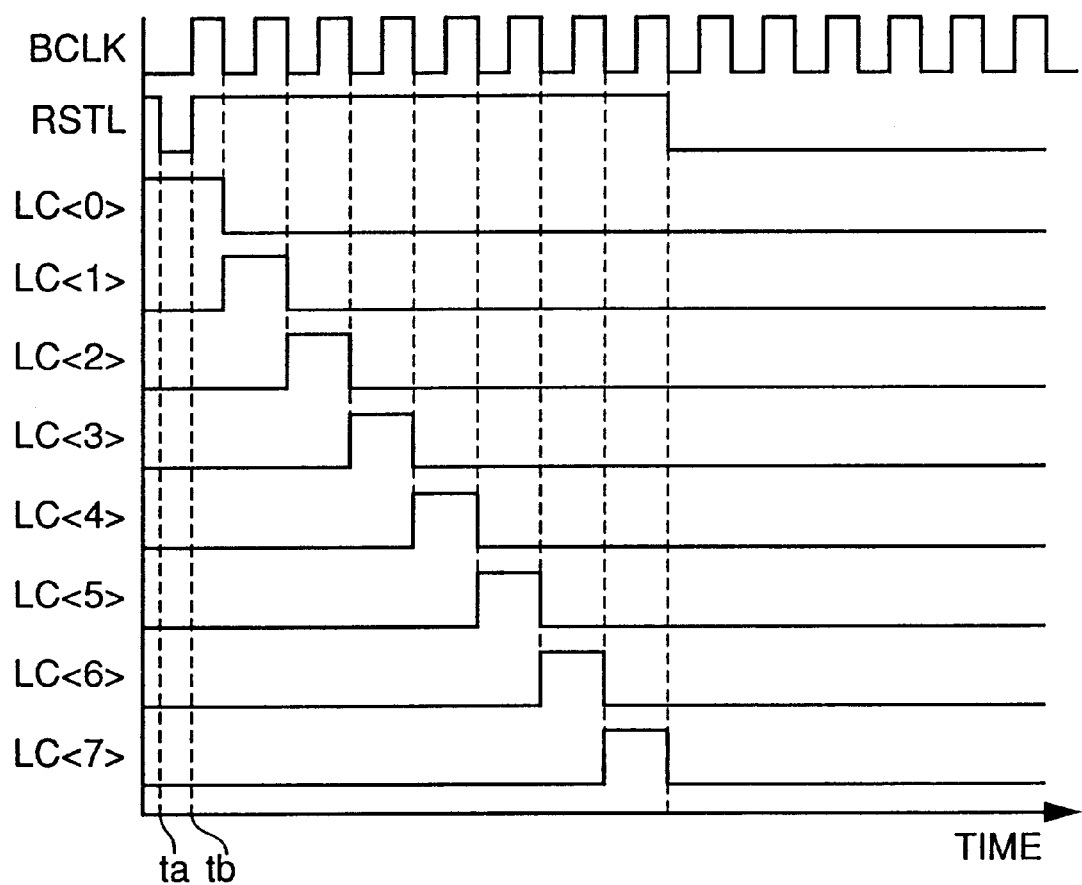
FIG. 15 is a timing chart for explaining timings of activating latch clocks LC<0> to LC<7>.

FIG. 15 is a timing chart for explaining the timings of activating the latch clocks LC<0> to LC<7>.

Referring to FIG. 15, first, in order to start generating a latch clock, before time ta, the reset signal RSTL is once inactivated (to the H level). and the latch clock LC<0> is set to the H level. Further, in order to initialize the latch clocks LC<1> to LC<7>, the reset signal RSTL is activated (to the L level) at time ta.

In this state, only the latch clock LC<0> outputted as an initial value from the JK flip flop 172-0 goes high and the other latch clocks LC<1> to LC<7> are set to the L level. In this period, the redundancy code line PDL is used to transfer the redundancy code PC<0> between the data converting units 155-0 and 165-0.

At time tb corresponding to the next timing of activating the clock BCLK, by inactivating the reset signal RST (to the H level), in response to the trailing edge of the clock BCLK, the latch clocks LC<1> to LC<7> are sequentially activated (to the H level) during one cycle of the clock BCLK.

By controlling the data converting units 155-0 to 155-7 and 165-0 to 165-7 arranged in correspondence with the redundancy codes PC<0> to PC<7> by using.the latch clocks LC<0> to LC<7>, transfer of each of the redundancy codes via the redundancy code line PDL can be executed in response to each of the timings of activating the latch clocks LC<0> to LC<7>. Specifically, by the redundancy code data stream signal PDS outputted to the redundancy code line PDL, the redundancy codes PC<0> to PC<7> are transmitted between the redundancy repair analyzing unit 130 and the repair determining circuit 70 by time division.

With such a configuration, the redundancy code consisting of a plurality of bits generated in parallel can be transmitted via a single signal line. As a result, effects such that the number of signal lines is decreased, wire delay reduction and the layout reduction can be realized.

As shown in FIG. 11, with the configuration in which the redundancy code stream signal PDS can be outputted to the outside via the internal line 8 from the group LPGA of external pin terminals, the number of external pin terminals necessary to detect a redundancy code can be reduced.

Fifth Embodiment

In the first embodiment, the configuration of storing the redundancy code indicative of a defect address by the latch circuit in a volatile manner has been described. In the fifth embodiment, a configuration of storing the redundancy codes in a nonvolatile manner will be described.

Figure 16:
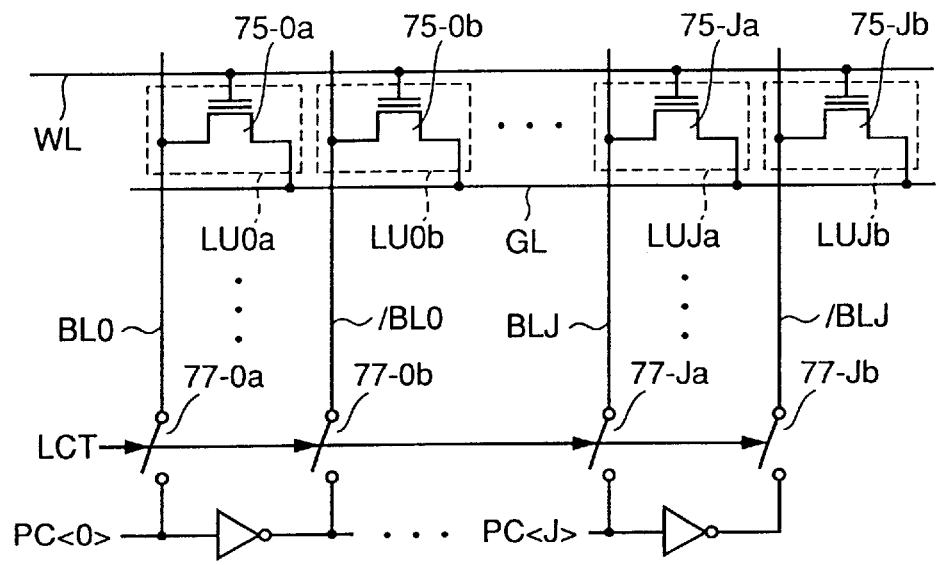
FIG. 16 is a circuit diagram showing the configuration of a repair determining circuit according to a fifth embodiment.

FIG. 16 is a circuit diagram showing the configuration of a repair determining circuit according to the fifth embodiment.

FIG. 16 shows the configuration of a portion for storing the redundancy codes PC<0> to PC<J> in the repair determining circuit 70.

In the fifth embodiment, different from the case shown in FIG. 5, each of the latch units included in the repair determining circuit 70 is constructed by a single nonvolatile memory cell.

Referring to FIG. 16, the repair determining circuit 70 has a plurality of nonvolatile memory cells arranged in matrix which are provided to store redundancy codes. The plurality of memory cells arranged in the same row store the redundancy codes PC<0> to PC<J> corresponding to one defect address.

In FIG. 16, latch units LU0a and LU0b for storing the redundancy code PC<0> and its inversion code /PC<0>, and latch units LUJa and LUJb for storing the redundancy code PC<J> and its inversion code /PC<J> are shown as representatives. The latch units LU0a and LU0b to LUJa and LUJb have nonvolatile memory cells 75-0a and 75-0b to 75-Ja and 75-Jb, respectively. As a nonvolatile memory cell, it is sufficient to apply, for example, a flush memory as a kind of an EEPROM (Electrically Erasable and Programmable Read Only Memory). Similar configuration is provided in correspondence with each of bits of the redundancy code.

A word line WL and a ground line GL are provided in correspondence with each of the rows of the nonvolatile memory cell. (J+1) bit line pairs BL0 and /BL0 to BLJ and /BLJ are provided in correspondence with the columns of the nonvolatile memory cell. The bit line pairs BL0 and /BL0 to BLJ and BLJ are coupled to nodes for transmitting the redundancy codes PC<0> and /PC<0> to PC<J> and /PC<J> via switches 77-0a and 77-0b to 77-Ja and 77-Jb, respectively.

In the case of writing redundancy codes into the group of nonvolatile memory cells, in association with the activation of the latch instruction signal LCT, switches 77-0a and 77-0b to 77-Ja and 77-Jb are turned on and the word line WL is activated. By the operations, the redundancy codes PC<0> and /PC<0> to PC<J> and /PC<J> are stored in one row in the group of nonvolatile memory cells.

When it is necessary to read a stored redundancy code for the selector 72 shown in FIG. 6 at the time of determining the redundancy repair, the word line WL is activated (to the H level) at a timing of executing the redundancy repair determination. In this case, the switches 77-0a and 77-0b to 77-Ja and 77-Jb are in the off state, and the redundancy codes stored in the nonvolatile memory cells are transmitted to the selector 72.

Since redundancy codes are written and read to/from the group of nonvolatile memory cells corresponding to the same repair determining circuit 70 at the same timings, when the group of nonvolatile memory cells corresponding to the same redundancy code are arranged in the same column and the group of nonvolatile memory cells for forming the same repair determining circuit 70 are arranged in the same row, the reading and writing operations on the nonvolatile memory cells forming the latch unit can be efficiently executed.

As described above, by using the nonvolatile memory such as an EEPROM to store the redundancy code, when the self test and an operation of storing the redundancy code are executed only once at the time of a product test, it becomes unnecessary to conduct a self test as part of the start-up sequence every time the power source is activated after that.

Sixth Embodiment

In the sixth embodiment, the configuration of sharing the BIST circuit by a plurality of DRAM cores will be described.

Figure 17:
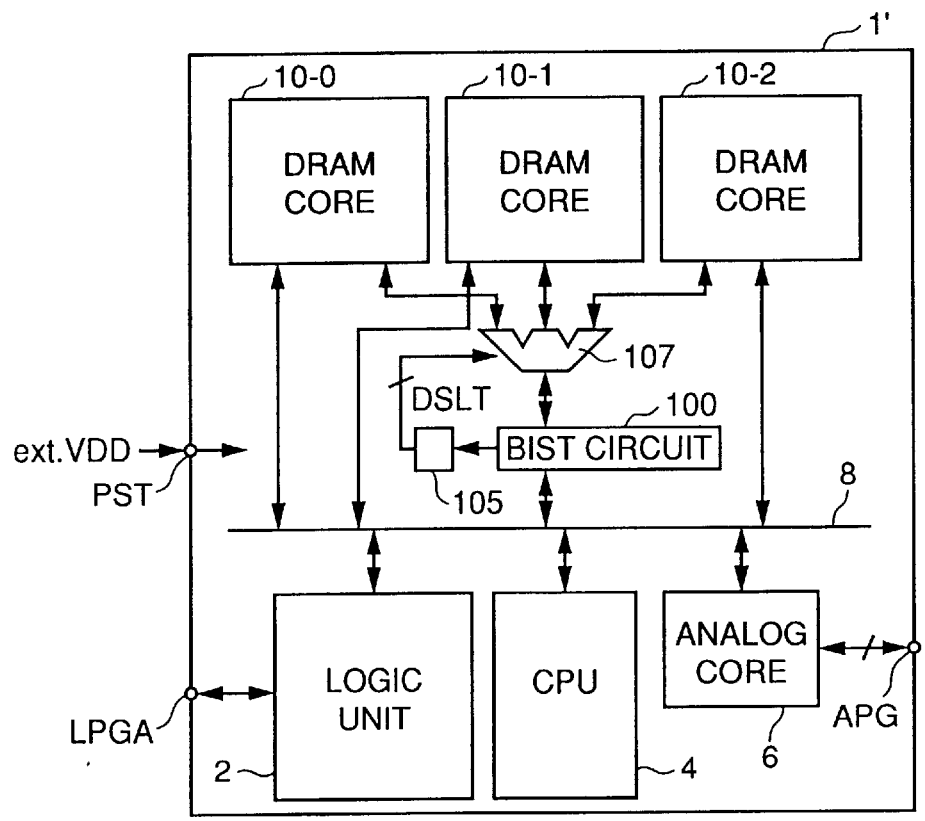
FIG. 17 is a block diagram showing the configuration of a semiconductor integrated circuit device according to a sixth embodiment of the invention.

FIG. 17 is a block diagram showing the configuration of a semiconductor integrated circuit device 1' according to the sixth embodiment of the invention.

Referring to FIG. 17, the configuration of the semiconductor integrated circuit device 1' is different from that of the semiconductor integrated circuit device 1 shown in FIG. 1 with respect to the point that the BIST circuit 100 is provided not on the inside of each of the plurality of DRAM cores but on the outside of the DRAM core.

The semiconductor integrated circuit device 1' further comprises: a selection control circuit 105 for generating a selection signal DSLT<0:1> specifying a DRAM core as a target of an operation test by the BIST circuit 100; and a selector 107 provided between the BIST circuit 100 and the plurality of DRAM cores 10.

The selector 107 couples one of a plurality of DRAM cores 10-0, 10-1 and 10-2 which is selected in accordance with the selection signal DSLT<0:1> and the BIST circuit 100, thereby forming a signal transmission path between them.

When the operation test on one of the DRAM cores is finished, the BIST circuit 100 generates a trigger signal to the selection control circuit 105. The selection control circuit 105 counts up the selection signals DSLT<0:1> one by one in response to the trigger signals and sequentially switches the DRAM cores to which a signal can be transmitted from the BIST circuit 100.

The configuration of each of the DRAM cores in the semiconductor integrated circuit device 1' is obtained by eliminating the BIST circuit 100 from the configuration shown in FIG. 2. The other configuration is similar to that of FIG. 2. Since the operation test to be carried out on the DRAM core 10 which is selected by the selector 107 and is made possible to transmit/receive a signal to/from the BIST circuit 100 is similar to that in the first embodiment, the description will not be repeated here. The DRAM core 10 can be also modified as described in each of the second to fifth embodiments.

Since the other elements of the semiconductor integrated circuit device 1' such as the logic unit 2, the CPU 4 and the analog core 6 are similar to those shown in FIG. 1, their description will not be repeated here.

With such a configuration, the BIST circuit which conducts an operation test can be shared by the DRAM cores. Thus, by combining any of the first to fifth embodiments with the semiconductor integrated circuit device on which the plurality of DRAM cores are mounted, the circuit area can be further reduced.

Although the number of DRAM cores is three in FIG. 17, it is just an example. The number of DRAM cores can be arbitrary. In this case, the number of bits of the selection signal DSLT may be determined according to the number of DRAM cores mounted.

Seventh Embodiment

In the seventh embodiment, a configuration capable of changing setting of operation parameters at the time of a self test will be described.

In the seventh embodiment, as an example, a configuration capable of adjusting a refresh cycle that specifies a refresh operation executing cycle at the time of a self test by the BIST circuit will be described.

Figure 18:
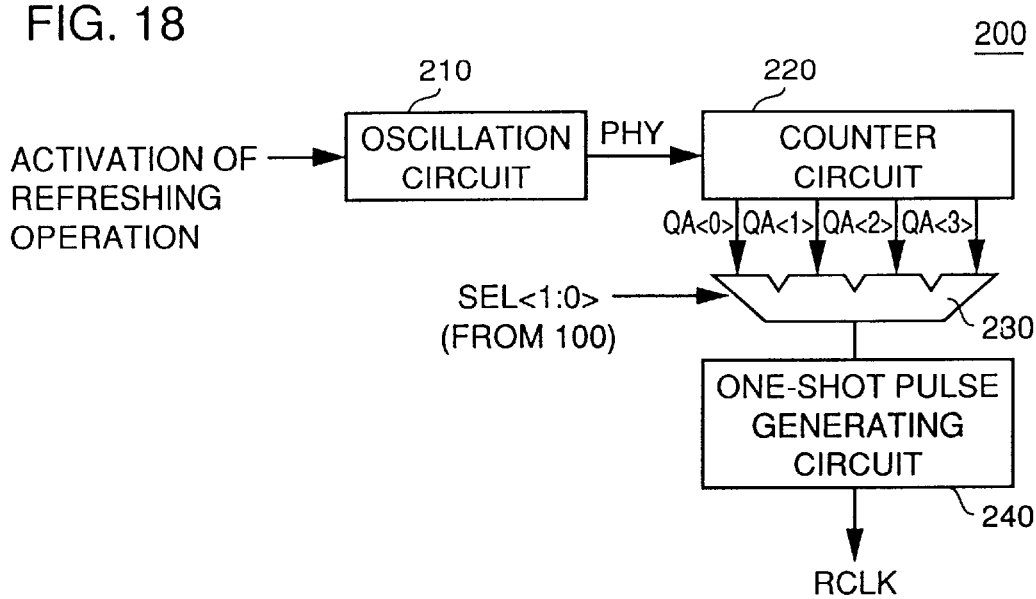
FIG. 18 is a block diagram showing the configuration of a refresh clock generating circuit according to the sixth embodiment.

Reffering to FIG. 18, a refresh clock generating circuit 200 generates a refresh clock RCLK for instructing a cycle of executing a refreshing operation in response to the activation of the refreshing operation. For example, according to a selection signal SEL<1:0> of two bits, the frequency of the refresh clock RCLK can be set in four (=$2^2$) levels.

The refresh clock generating circuit 200 comprises: an oscillation circuit 210 for generating an oscillation signal PHY of a constant frequency in response to activation of a refreshing operation; a counter circuit 220 for generating four clock signals QA<0> to QA<3> of different frequencies in response to the oscillation signal PHY; a selector 230 for selectively outputting one of the clock signals QA<0> to QA<3> in accordance with a selection signal SEL<1:0>; and a one-shot pulse generating circuit 240 for generating a refresh clock RCLK which is made active for a predetermined period in response to the activation of the clock signal outputted from the selector 230.

Figure 19:
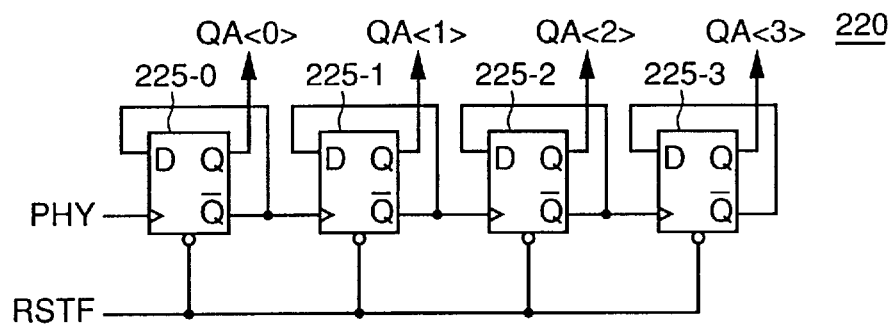
FIG. 19 is a block diagram showing the configuration of a counter circuit shown in FIG. 18.

Referring to FIG. 19, the counter circuit 220 includes flip-flops 225-0 to 225-3 of four stages which are connected in series. The oscillation signal PHY is supplied to the flip-flop 225-0 at the first stage. The flip-flops 225-0 to 225-3 output clock signals QA<0> to QA<3>, respectively.

A reset signal RSTF is provided common to the flip-flops 225-0 to 225-3. In response to the activation (to the L level) of the reset signal RSTF, each of the clock signals QA<0> to QA<3> is fixed at the L level.

Figure 20:
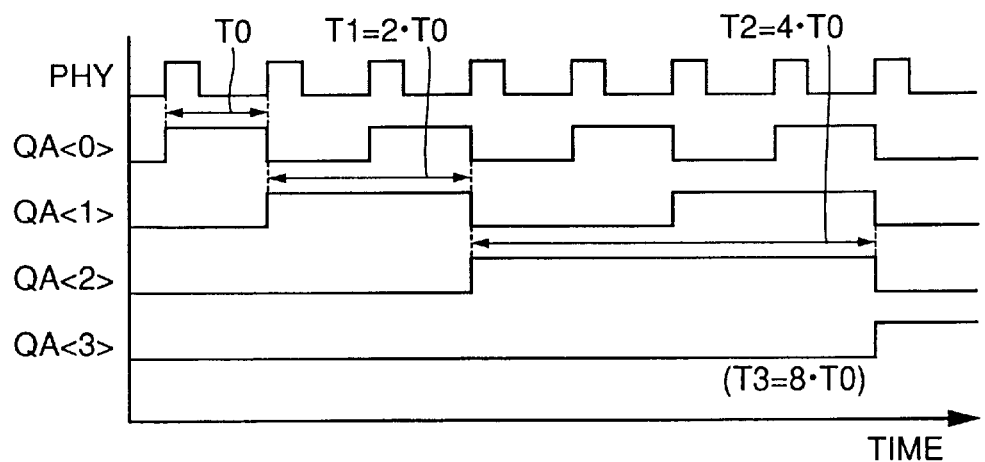
FIG. 20 is a timing chart for explaining the operation of the counter circuit shown in FIG. 18.

Referring to FIG. 20, the clock signal QA<0> outputted from the flip-flop 225-0 at the first stage has the same frequency (cycle TO) as that of the oscillation signal PHY generated by the oscillation circuit 210. The clock signal QA<1>outputted from the flip-flop 225-1 at the second stage has a cycle which is twice as long as that of the clock signal QA<0>. The clock signal QA<2> outputted from the flip-flop 225-2 at the third stage has a cycle which is twice as long as that of the clock signal QA<1>. The clock signal QA<3> outputted from the flip-flop 225-3 at the fourth stage has a cycle which is twice as long as that of the clock signal QA<2>. The cycle T1 of the clock signal QA<1> is therefore twice as long as the cycle T0. Similarly, the cycle T2 of the clock signal QA<2> is four times as long as the cycle T0, and the cycle T3 of the clock signal QA<3> is eight times as long as the cycle T0.

By selecting one of the four clock signals QA<0> to QA<3> of different frequencies by the selector 230 and outputting it as a refresh clock RCLK, the self test by the BIST circuit can be conducted with parameters which are severer than those of the refreshing operation in normal operation. Further, since the refresh cycle can be adjusted step by step, a self test can be executed with desired test parameters.

Modification of Seventh Embodiment

In a modification of the seventh embodiment, a configuration capable of conducting operation tests of the upper and lower limits of an operating voltage will be described.

In the modification of the seventh embodiment, a configuration capable of adjusting a voltage level of an internal power voltage int.VDD step by step at the time of a self test, which is generated by a voltage down converter (VDC) 85 provided in a power circuit 80 shown in FIG. 2 will be described. By the configuration, for example, a self test with the parameter of the upper or lower power voltage can be conducted.

Figure 21:
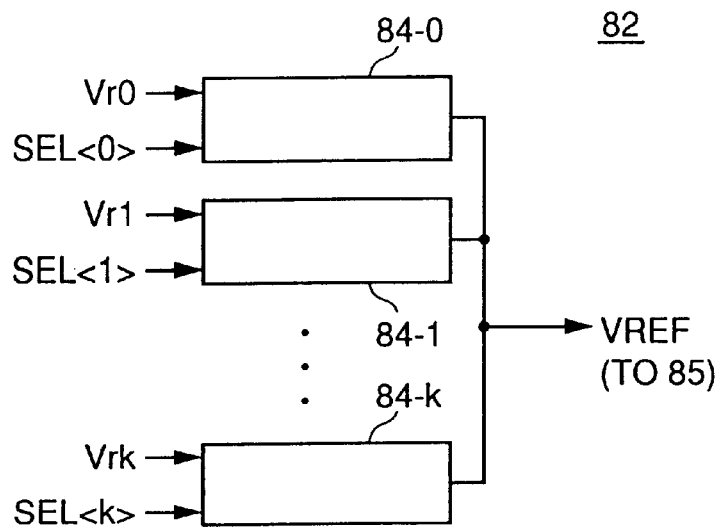
FIG. 21 is a block diagram showing the configuration of a set potential generating circuit.

Referring to FIG. 21, a reference voltage generating circuit 82 sets a reference voltage VREF supplied to the voltage down converter 85 to any of reference voltages Vr0 to VrK in accordance with one of selection signals SEL<0> to SEL<k> (k: natural number).

Figure 22:
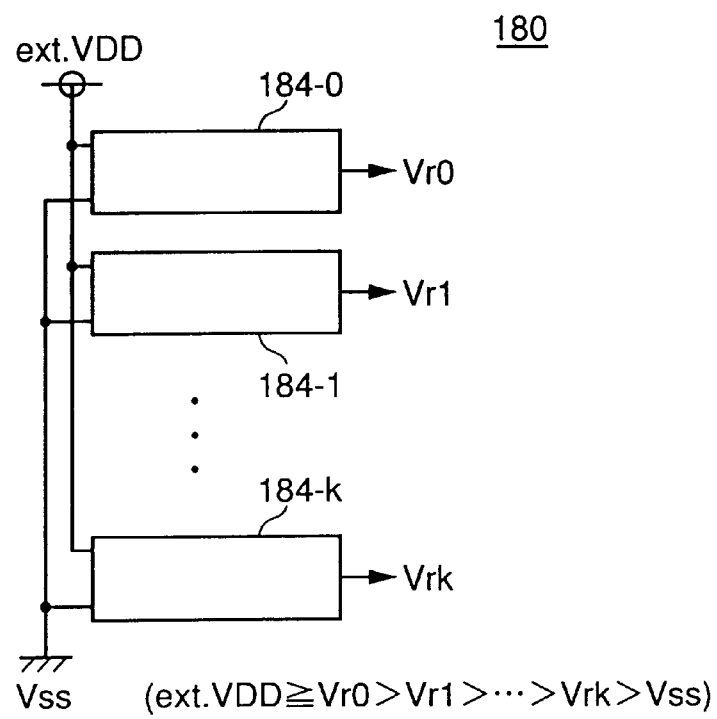
FIG. 22 is a block diagram showing the configuration of a reference potential generating circuit.

FIG. 22 is a block diagram showing the configuration of a sub reference voltage generating circuit 180 for generating the reference voltages Vr0 to Vrk.

Referring to FIG. 22, the sub reference voltage generating circuit 180 receives both an external power voltage ext.VDD and a ground level Vss and generates the reference voltages Vr0, Vr1, . . . , Vrk. The reference voltages Vr0, Vr1, . . . , Vrk are set step by step within the range of the power voltage ext.VDD and the ground level Vss.

Referring again to FIG. 21, the sub reference voltage generating circuit 82 has analog buffers 84-0 to 84-k provided in correspondence with the reference voltages Vr0 to Vrk, respectively. The selection signal SEL<0> to SEL<k> are supplied to the analog buffers 84-0 to 84-k, respectively.

Any one of the selection signals SEL<0> to SEL<k> is selectively activated, and the reference voltage VREF is generated in the analog buffer corresponding to the activated selection signal.

Figure 23:
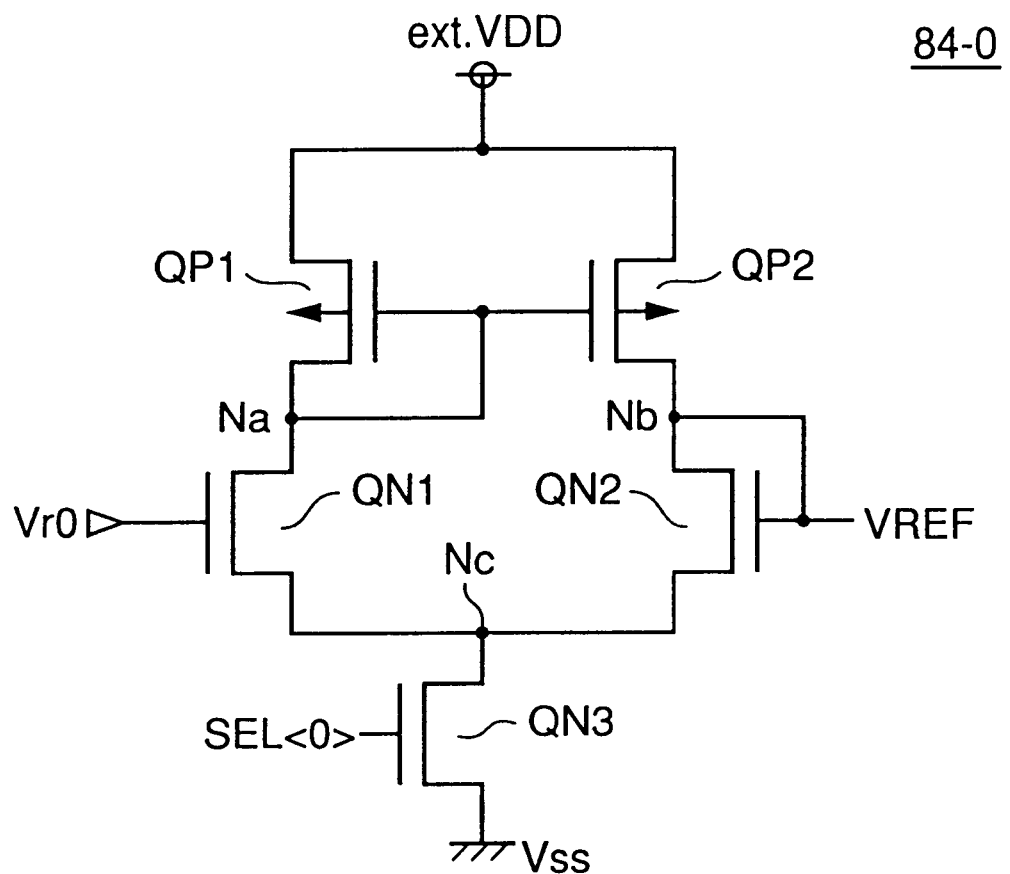
FIG. 23 is a circuit diagram showing the configuration of an analog buffer.

FIG. 23 is a circuit diagram showing the configuration of the analog buffer 84-0. Since the analog buffers 84-0 to 84-k have similar constructions, the configuration of the analog buffer 84-0 is shown as a representative in FIG. 23.

Referring to FIG. 23, the analog buffer 84-0 has: P-type MOS transistors QP1 and QP2 which are electrically coupled between the external power voltage ext.VDD and nodes Na and Nb, respectively: N-type MOS transistors QN1 and QN2 coupled between the nodes Na and Nb and a node Nc, respectively; and an N-type MOS transistor QN3 electrically coupled between the node Nc and a ground level Vss.

The gates of the transistors QP1 and QP2 are coupled to the node Na. The node Nb is coupled to the gate of the transistor QN2. The gates of the transistors QN1 and QN2 are coupled to a node for transmitting the reference voltage VrO and a node for transmitting the reference voltage VREF, respectively. The selection signal SEL<0> is supplied to the gate of the transistor QN3.

With the configuration, when the selection signal SEL<0> is activated, an operating current for amplifying the voltage difference between the gates of the transistors QN1 and QN2 is supplied to the group of transistors in the analog buffer 84-0. When the operating current is supplied, the node Nb is charged in accordance with the voltage difference between the gates of the transistors QN1 and QN2, that is, the voltage difference between the reference voltage Vr0 and the reference voltage VREF. The level of the reference voltage VREF generated at the node Nb is therefore equal to that of the voltage Vr0 supplied to the gate of the transistor QN1.

Referring again to FIG. 21, any one of the analog buffers 84-0 to 84-k is selected in response to one of the selection signals SEL<0> to SEL<k> and receives the operating current. As a result, in the selected analog buffer, the voltage VREF having a voltage level according to the corresponding reference voltage is generated.

With such a configuration, by selectively activating any one of the selection signals SEL<0> to SEL<k>, the reference voltage VREF can be changed step by step. The internal power voltage int.VDD based on the reference voltage VREF which is set as described above is outputted from the voltage down converter 85. Under these conditions, a self test by the BIST circuit 100 is conducted. Thus, a self test can be conducted, for example, under a desired parameter in which the internal power voltage is set severer than that in normal operation.

Eighth Embodiment

In the first to seventh embodiments, the configuration of storing a redundancy code by the latch operation in the repair determining circuit 70 without using a fuse device and executing the redundancy repair based on the redundancy code has been described.

As already described, by employing such a configuration, it becomes unnecessary to provide a fuse device, so that the limitation on layout design such that an area on a fuse device cannot be used as an interconnection area of a chip can be avoided. An advantage such that redundancy repair can be performed without using an expense laser trimming apparatus can be also obtained.

In such a configuration, however, all of test items necessary for redundancy repair have to be executed in a self test as a part of a start-up sequence started in response to the turn-on of the power. Consequently, a problem such that time required for a self test increases and time necessary to complete the start-up sequence of a whole semiconductor integrated circuit device increases may occur.

On the other hand, in a high-value-added memory device typified by an ultra-low power consumption memory, chip cost can be set high to a certain extent. Consequently, the problem of the limitation on the layout design due to the arrangement of fuse devices, that is, an area penalty is not so serious.

In such a device, therefore, by using the conventional configuration of programming a redundancy code for repairing a defect detected by a wafer test using a regular memory tester by a fuse device, and detecting a defect which occurs after execution of the programming by a self test based on the BIST function when the power is turned on, detection of a defect and redundancy repair on a detected defect can be efficiently executed.

In such a configuration, a typical example of a defect expected to be detected by a self test is a hardware failure or a field failure caused by acceleration of a defective portion hidden in an insulating film or the like which occurs in a reliability test and a burn-in test executed for cleaning after assembling a semiconductor chip in a package. In the following, a defect occurring after a wafer test will be also called an "fter defect". The after defect includes a defect which occurs after a product is shipped as described above.

Figure 24:
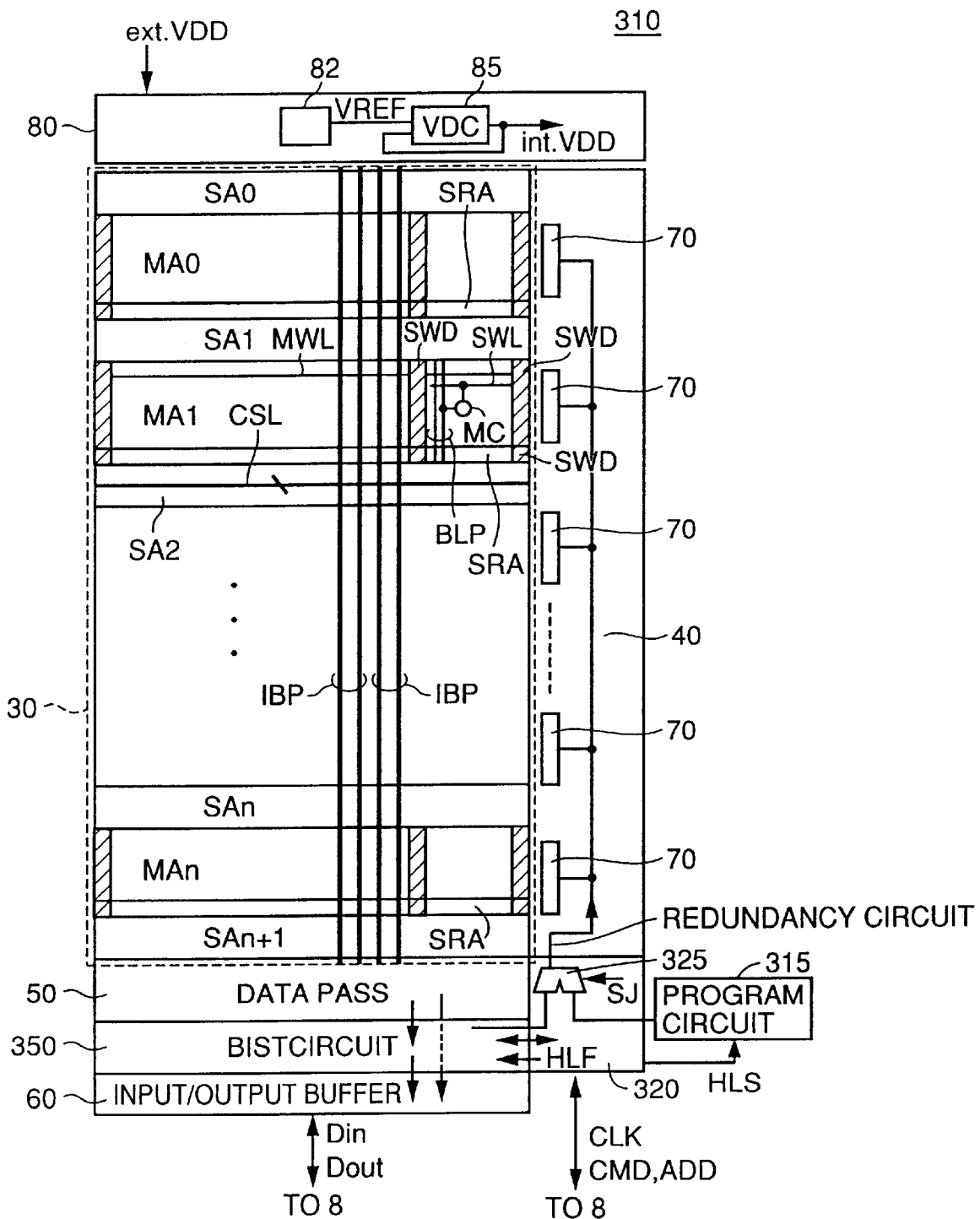
FIG. 24 is a block diagram for explaining the configuration of a DRAM core 310 according to an eighth embodiment of the invention.

Referring to FIG. 24, a DRAM core 310 according to the eighth embodiment is different from the DRAM core 10 shown in FIG. 2 with respect to the points that a program circuit 315 is further provided and that a control circuit 320 and a BIST circuit 350 are provided in place of the control circuit 20 and the BIST circuit 100.

The program circuit 315 has a function similar to that of the fuse circuit 530 shown in FIG. 27 and stores, in a non-volatile manner, replacement repair information for repairing a defect detected at the time of an operation test such as a wafer test by a conventional redundancy repair method using a memory tester or the like. Specifically, the program circuit 315 has a plurality of program devices (not shown) for storing information in a non-volatile manner in response to a blow input from the outside. A typical example of such a program device is a fuse device.

In the program circuit 315, according to a standard similar to the redundancy code to be stored in the repair determining circuit 70, redundancy repair information is stored in a non-volatile manner. The redundancy repair information stored in the program circuit 315 will be therefore also called a redundancy code.

The program circuit 315 can be disposed outside of the DRAM core as a hardware macro. In the case of using a fuse device as the program device, a redundancy code necessary to repair a defect detected by a conventional wafer test using a memory test is programmed by blowing a fuse by a laser trimming apparatus or the like.

The BIST circuit 350, having a function similar to that of the BIST circuit 100, conducts a self test, and generates a redundancy code on the basis of a result of the self test. In the configuration according to the eighth embodiment, test items of the self test are limited to the target which is the after defect, so that they are lessened as compared with the case of the BIST circuit 100 used in the first to seventh embodiments. In the BIST circuit 350, therefore, the memory capacity of a non-volatile memory (corresponding to the program unit 122 shown in FIG. 3) such as a ROM for storing a test program can be set to a small value. Further, the time required for a self test can be shortened.

In addition to the function of the control circuit 20 described by referring to FIG. 2, the control circuit 320 generates a fuse load start signal HLS for instructing reading of a redundancy code from the program circuit 315 and a fuse load end signal HLF indicating that the reading of the redundancy code from the program circuit 315 is finished.

The control circuit 320 further includes a selector 325. In accordance with a control signal SJ, the selector 325 transmits one of the redundancy codes transmitted from the program circuit 315 and the BIST circuit 350 to one of a plurality of repair determining circuits 70 disposed in the decoding band 40.

In a start-up sequence at the time of turn-on of power, a redundancy code programmed in the program circuit 315 is transmitted via the selector 325 to the repair determining circuit 70. The redundancy code transmitted is stored in the repair determining circuit 70 and used for redundancy repair in normal operation.

When transmission of all of redundancy codes programmed in the program circuit 315 is completed, the control circuit 320 activates the fuse load end signal HLF to be transmitted to the BIST circuit 350.

Usually, it is rare to use a whole row spare area and a whole column spare area disposed in each memory mat in the redundancy repair at the time of a wafer test, and an unused spare area is left. Consequently, a configuration of storing a redundancy code corresponding to an after defect and executing redundancy repair is achieved by using the repair determining circuit 70 corresponding to an unused spare area.

Figure 25:
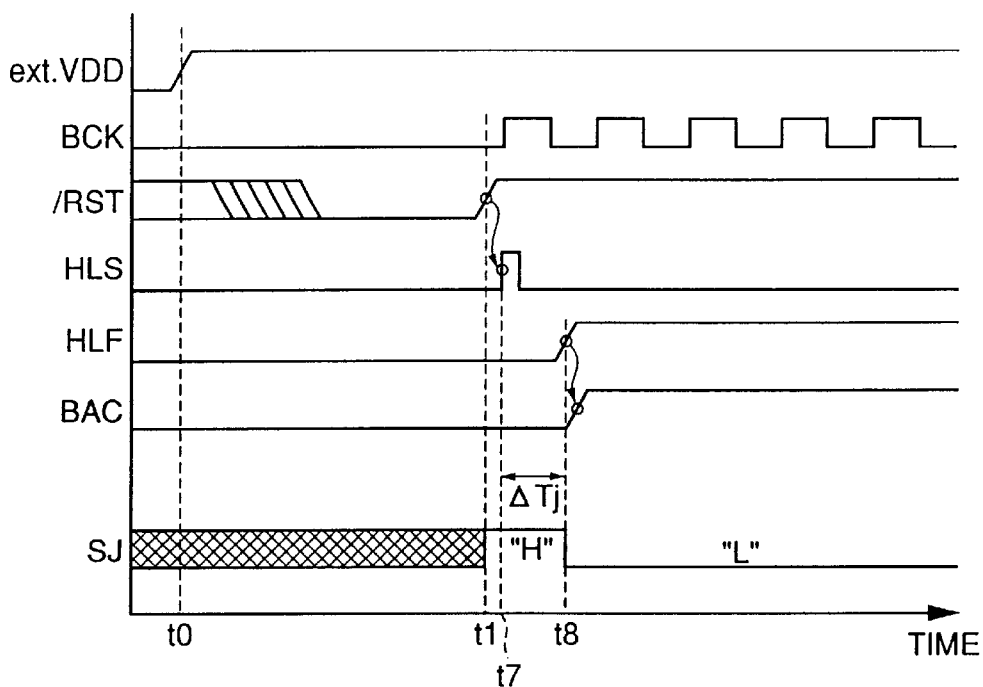
FIG. 25 is a timing chart for explaining an execution timing of a self test according to the eighth embodiment.
Figure 26:
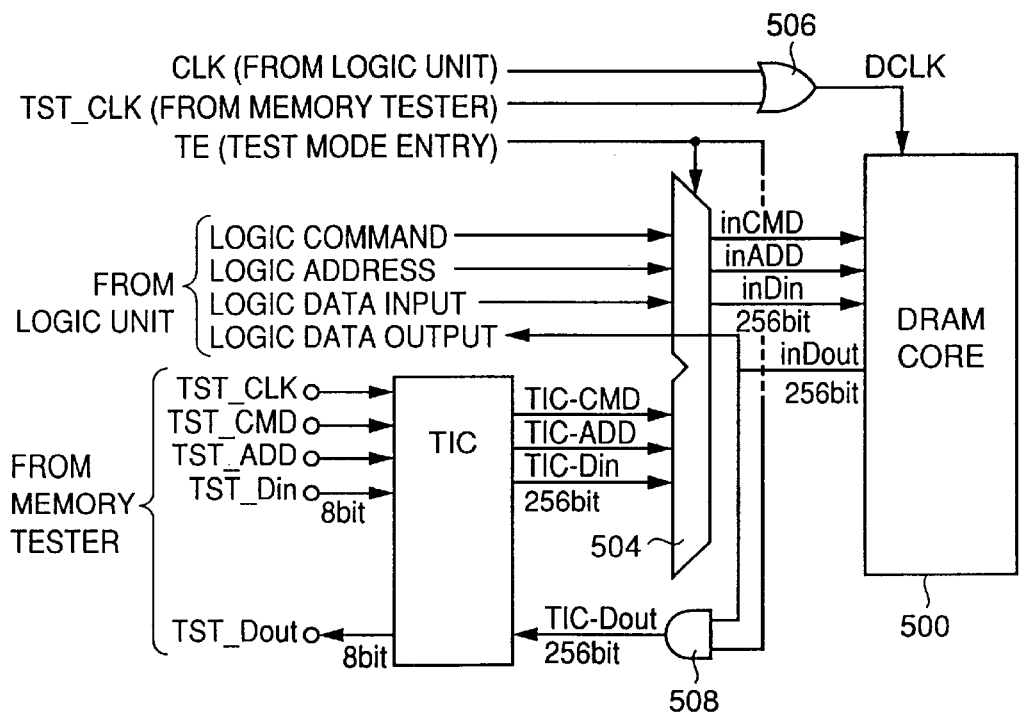
FIG. 26 is a block diagram for explaining a direct memory access test using a test interface circuit.

FIG. 25 is a timing chart for explaining an execution timing of an operation test according to the eighth embodiment.

Referring to FIG. 25, at time t0, an external power supply is activated and the power supply potential ext.VDD rises. The reset signal /RST is made uncertain for a predetermined period until the power supply potential ext.VDD becomes stable, and is activated to the L level to initialize the internal conditions of a semiconductor integrated circuit device. After completion of the initialization of the internal conditions, at time tl, the reset signal /RST is inactivated to the H level, and a start-up sequence is started.

By using the inactivation (from the L level to the H level) of the reset signal /RST as a trigger, the control circuit 320 activates the fuse load start signal HLS in a one shot manner. In response to the activation of the fuse load start signal HLS, the program circuit 315 outputs a redundancy code to be stored on the inside in a non-volatile manner to the selector 325.

During the period, the control signal SJ is set to the H level (the program circuit 315 selection side). Consequently, a redundancy code preliminarily stored in the program circuit 315 in a non-volatile manner is transmitted to the repair determining circuit 70 and is latched.

At time t8 after elapse of predetermined time ATj determined corresponding to time required to transfer a redundancy code from the program circuit 315 from the time t7, the control circuit 320 makes the fuse load end signal HLF active (to the H level).

In response to the activation of the fuse load end signal HLF, in the BIST circuit 350, a BIST activation signal BAC is activated to the H level to instruct the activation of the self test, and generation of the test clock BCK used for the self test is started.

At time t8 and after that, a redundancy code corresponding to a defect detected by the self test conducted by the BIST circuit 350 is generated. In this period, the control signal SJ is set to the L level (BIST circuit 350 selection side), so that the redundancy code generated by the BIST circuit 350 is transmitted to the repair determining circuit 70 and is latched.

The BIST circuit 350 conducts a self test similar to that of the BIST circuit 100. As already described, the test items of the self test conducted by the BIST circuit 350 can be minimized as compared with the case of the BIST circuit 100 described in the first to seventh embodiments. Consequently, the self test use period at the time of turn-on of the power can be shortened, and time required to complete the start-up sequence of the whole semiconductor integrated circuit device can be shortened.

In a manner similar to the first to seventh embodiments, by conducting the self test each time the power is turned on, an after defect which newly occurs can be subjected to redundancy repair. Thus, the improved yield by repairing a defect can be realized.

To the DRAM core according to the eighth embodiment as well, a combination of the configuration of layout of the BIST circuit and the repair determining circuit, and a change in setting of operation condition parameters at the time of a self test conducted by the BIST circuit shown in the first to seventh embodiments can be applied.

For example, like the configuration shown in FIG. 11, the data converting circuit 150 can be disposed among the selector 325, the program circuit 315, and the BIST circuit 350, and the data converting circuit 160 can be disposed between the selector 350 and the repair determining circuit 70. As a result, in a manner similar to the fourth embodiment, effects such that the number of signal lines for transmitting the redundancy code is reduced, and wire delay and the layout area are reduced can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for inputting/outputting data in accordance with an input address, comprising:
   a memory cell array for storing said data by a plurality of regular memory cells and spare memory cells;
   a self test circuit for conducting an operation test on said memory cell array to detect a defective memory cell, said self test circuit including
      a self test control unit for activating said operation test at predetermined time, and
      a redundancy repair analyzing unit for analyzing data outputted from said memory cell array in said operation test and outputting a plurality of redundancy code signals for indicating a defect address corresponding to said defective memory cell; and
   a decoding circuit for selecting a memory cell as a target of data input and output in accordance with said input address,
   said decoding circuit including
      a repair determining circuit for instructing an access to said spare memory cell when said input address and said defect address coincide with each other,
      said repair determining circuit having a plurality of redundancy code holding circuits provided in correspondence with said plurality of redundancy code signals, and
      each of said plurality of redundancy code holding circuits taking in a signal level of a corresponding one of said plurality of redundancy code signals outputted from said redundancy repair analyzing unit in said operation test and holding the taken signal level.

2. The semiconductor memory device according to claim 1, wherein
   said self test control unit activates said operation test on said semiconductor memory in response to turn-on of a power, and
   each of said plurality of redundancy code holding circuits stores the taken signal level while the power is on.

3. The semiconductor memory device according to claim 2, wherein
   said self test control unit activates said operation test also in response to an external instruction, and
   the redundancy repair analyzing unit includes:
      a redundancy code generating unit for generating said plurality of redundancy code signals;
      a redundancy code storing unit for storing said plurality of redundancy code signals generated for said operation test which has conducted in the past; and
      a redundancy code analyzing unit for outputting information regarding occurrence of a new defective memory cell based on the plurality of redundancy code signals generated by the redundancy code generating unit and the plurality of redundancy code signals stored in said redundancy code storing unit.

4. The semiconductor memory device according to claim 2, wherein
   said self test control unit activates said operation test also in response to an external instruction, and
   said redundancy repair analyzing unit includes:
      a redundancy code generating unit for generating a plurality of redundancy code signals on the basis of a result of the operation test;
      a redundancy code storing unit for storing the plurality of redundancy code signals generated in correspondence with said operation test which has conducted in the past; and
      a redundancy code updating unit for outputting said plurality of redundancy code signals corresponding to a defective memory cell stored in the redundancy code storing unit and a newly detected defective memory cell based on the plurality of redundancy code signals stored in said redundancy code storing unit and the plurality of redundancy code signals generated by said redundancy code generating unit.

5. The semiconductor memory device according to claim 4, wherein
   said external instruction is generated according to an operating state of a system in which said semiconductor memory device is assembled.

6. The semiconductor memory device according to claim 1, wherein
   said self test control unit generates a test clock signal having a predetermined frequency in said operation test,
   said semiconductor memory further comprises a redundancy code transmitting line disposed between said self test circuit and said decoding circuit,
   said self test circuit includes a first data converting circuit for receiving said plurality of redundancy code signals in parallel from said redundancy repair analyzing unit and outputting said plurality of redundancy code signals one by one in series to said redundancy code transmitting line in response to said test clock signal, and
   said decoding circuit includes a second data converting circuit for receiving said plurality of redundancy code signals one by one, which are outputted in series to said redundancy code transmitting line in response to said test clock signal, and outputting said plurality of redundancy code signals in parallel to said plurality of redundancy code holding circuits.

7. The semiconductor memory device according to claim 6, further comprising a signal terminal capable of transmitting/receiving a signal to/from the outside, wherein said self test circuit outputs data transmitted via said redundancy code transmitting line to said signal terminal.

8. The semiconductor memory device according to claim 1, wherein
each of said plurality of redundancy code holding circuits has a nonvolatile memory cell for holding the signal level taken.

9. The semiconductor memory device according to claim 1, further comprising an internal circuit for setting operating parameters in said semiconductor memory device, wherein
said self test control unit generates a plurality of parameter selection signals in accordance with an external instruction, and
said internal circuit sets said operating parameters step by step in accordance with said plurality of parameter selection signals in said operation test.

10. The semiconductor memory device according to claim 9, wherein
said internal circuit includes a refresh control unit for generating a refresh clock signal which specifies a cycle of executing a refreshing operation, and
said refresh control unit has
a clock generating unit for generating a plurality of internal clocks having different frequencies, and
a clock selecting circuit for outputting one of said plurality of internal clocks as said refresh clock signal in accordance with said plurality of parameter selection signals.

11. The semiconductor memory device according to claim 9, wherein
said internal circuit includes a power supply unit for supplying an internal power voltage of said semiconductor memory device, and
said power supply unit has
a reference voltage generating circuit for setting a level of a reference voltage in accordance with said plurality of parameter selection signals, and
a voltage adjusting circuit for maintaining said internal power voltage at said reference voltage.

12. A semiconductor integrated circuit device comprising:
a plurality of memory cores each for executing data input and output according to an input address,
each of said plurality of memory cores including
a memory cell array for storing data by a plurality of regular memory cells and a spare memory cell used to be replaced with a defective memory cell, and
a decoding circuit for selecting a memory cell as a target of the data input and output in accordance with said input address,
said decoding circuit including a repair determining circuit for instructing an access to said spare memory cell when said input address and a defect address corresponding to said defective memory cell coincide with each other,
said repair determining circuit having a plurality of redundancy code holding circuits provided in correspondence with a plurality of redundancy code signals for indicating said defect address,
each of said plurality of redundancy code holding circuits taking in a signal level of a corresponding one of said plurality of redundancy code signals in a operation test to detect said defective memory cell and holding the taken signal level;
a self test circuit which is shared by said plurality of memory cores and conducts said operation test on said memory cell array,
said self test circuit including
a self test control unit for activating said operation test, and
a redundancy repair analyzing unit for analyzing data outputted from said memory cell array in said operation test and outputting said plurality of redundancy code signals;
a selection control circuit for selecting one of said plurality of memory cores; and
a selector circuit provided between said plurality of memory cores and said self test circuit for coupling said one of the plurality of memory. cores and said self test circuit in accordance with selection by said selection control circuit.

13. The semiconductor integrated circuit device according to claim 12, wherein
said self test circuit generates a trigger signal in response to an end of said operation test on one of said plurality of memory cores, and
said selection control circuit switches a target of said selection in response to generation of said trigger signal.

14. The semiconductor integrated circuit device according to claim 12, wherein
said self test control unit activates said operation test in response to at least turn-on of a power to the semiconductor memory, and
each of said plurality of redundancy code holding circuits stores the taken signal level during the power is on.

15. The semiconductor integrated circuit device according to claim 12, wherein
each of said plurality of redundancy code holding circuits has a nonvolatile memory cell for holding the signal level taken.

16. A semiconductor memory device for inputting/outputting data in accordance with an input address, comprising:
a memory cell array for storing data by a plurality of regular memory cells and a plurality of spare memory units;
a program unit for storing, in a non-volatile manner, redundancy information for indicating an address of a defect corresponding to a preliminarily detected defective memory cell;
a self test circuit for conducting an operation test to detect said defective memory cell to said memory cell array,
the self test circuit including
a self test control unit for activating said operation test at predetermined time, and
a redundancy repair analyzing unit for analyzing data outputted from said memory cell array in said operation test and outputting redundancy information for indicating a defect address corresponding to a defective memory cell detected by said operation test;
a control unit for instructing each of said program unit and said redundancy repair analyzing unit to output said redundancy information; and
a decoding circuit for selecting a memory cell as a target of said data input and output in accordance with said input address,
said decoding circuit including a plurality of repair determining circuits provided for said plurality of spare memory units, and
each of said plurality of repair determining circuits storing one of said redundancy information outputted from said program unit and said redundancy repair analyzing unit and instructing an access to a corresponding one of said plurality of spare memory units when said defect address corresponding to said redundancy information stored coincides with said input address.

17. The semiconductor memory device according to claim 16, wherein said control unit includes a selector circuit for transmitting one of said redundancy information outputted from said program unit and said redundancy information outputted from said redundancy repair analyzing unit to said plurality of repair determining circuits, said control unit instructs said program unit to output said redundancy information at first time in response to activation of a power supply to said semiconductor memory device, said control unit instructs said self test control unit to start said operation test at second time after elapse of predetermined time since said first time, and said selector circuit transmits said redundancy information from said program unit to one of said plurality of redundancy determining circuits before said second time, and at said second time and after that, said redundancy information from said program unit is transmitted to one of said plurality of repair determining circuits.

18. The semiconductor memory device according to claim 16, wherein said program unit stores redundancy information corresponding to said defective memory cell detected at the time of a wafer test, said operation test is conducted in response to activation of the power supply to said semiconductor memory device, and each of said plurality of repair determining circuits stores said redundancy information in a volatile manner during the power is on.

* * * * *